United States Patent [19]

Lenhoff, Jr.

[11] Patent Number: 4,544,917
[45] Date of Patent: Oct. 1, 1985

[54] A/D CONVERTER HAVING DIGITALLY CONTROLLED SUBRANGING AND SELF-ALIGNMENT APPARATUS FOR USE THEREIN

[75] Inventor: John G. Lenhoff, Jr., Linthicum, Md.

[73] Assignee: Westinghouse Electric Corp., Pittsburgh, Pa.

[21] Appl. No.: 418,944

[22] Filed: Sep. 16, 1982

[51] Int. Cl.$^4$ .......................................... H03K 13/02
[52] U.S. Cl. .......................................... 340/347 AD
[58] Field of Search .............................. 340/347 AD

[56] References Cited

U.S. PATENT DOCUMENTS

| | | | |
|---|---|---|---|
| 3,541,315 | 11/1970 | Naydan et al. | 235/310 |
| 3,646,586 | 2/1972 | Kurz | 340/347 AD |
| 3,855,589 | 12/1974 | Sclender | 340/347 AD |
| 3,956,746 | 5/1976 | Lisle, Jr. et al. | 340/347 AD |
| 4,017,849 | 4/1977 | Tewksbury | 340/347 M |
| 4,107,669 | 8/1978 | Tewksbury | 340/347 AD |
| 4,193,066 | 3/1980 | Morrison et al. | 340/347 AD |
| 4,229,729 | 10/1980 | Devendorf et al. | 340/347 AD |
| 4,308,524 | 12/1981 | Harrison et al. | 340/347 AD |

Primary Examiner—Errol A. Krass
Assistant Examiner—Donna Angotti
Attorney, Agent, or Firm—W. E. Zitelli

[57] ABSTRACT

A subranging analog-to-digital converter is disclosed having digitally controlled subranging for eliminating switching gain and switching paths in the analog section thereof. The digitally controlled subranging apparatus may be applied to either a single time-shared quantizer embodiment or a converter embodiment including a plurality of simultaneously operated quantizers. In either case, the conversion is formed in a series of quantizer operations on a sampled analog signal input for forming a final accumulated digital word conversion representative thereof. Another aspect of the present invention includes the addition of apparatus in a subranging A/D converter for maintaining the pre-alignment of the various conversion dynamic subranges thereof. In this aspect, the subranges of the converter are prealigned to affect a unique set of digital conversion codes of subranged conversions of the analog signal input value corresponding to the conversion threshold transition regions between the pre-aligned subranges. An anomaly in the digital conversion codes of said analog signal input value is detected and used to govern the adjustment of the conversion dynamic range of at least one of the quantizers of the converter in order to ameliorate the anomalous condition.

8 Claims, 13 Drawing Figures

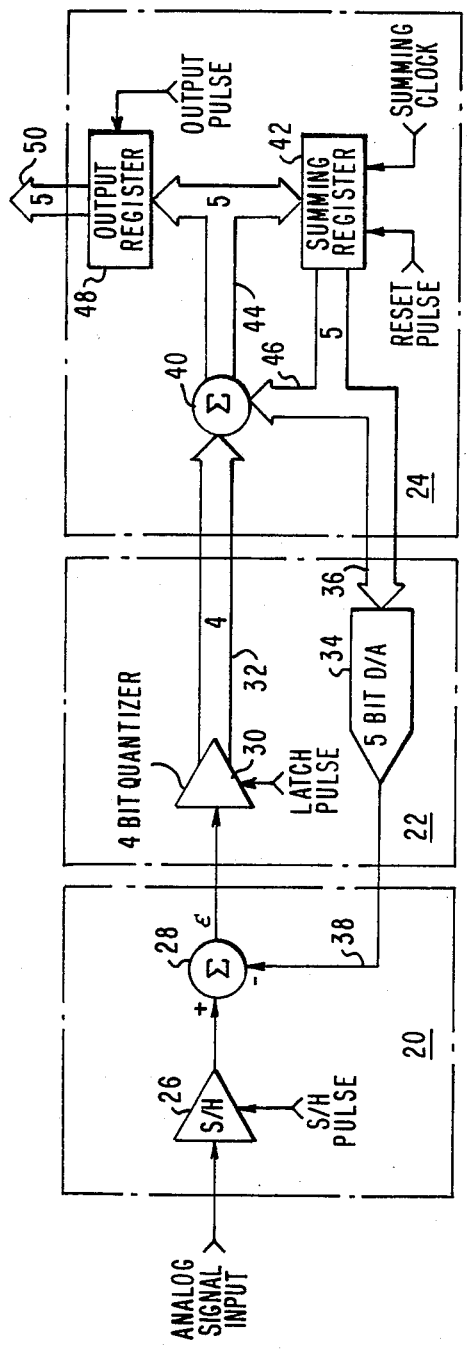
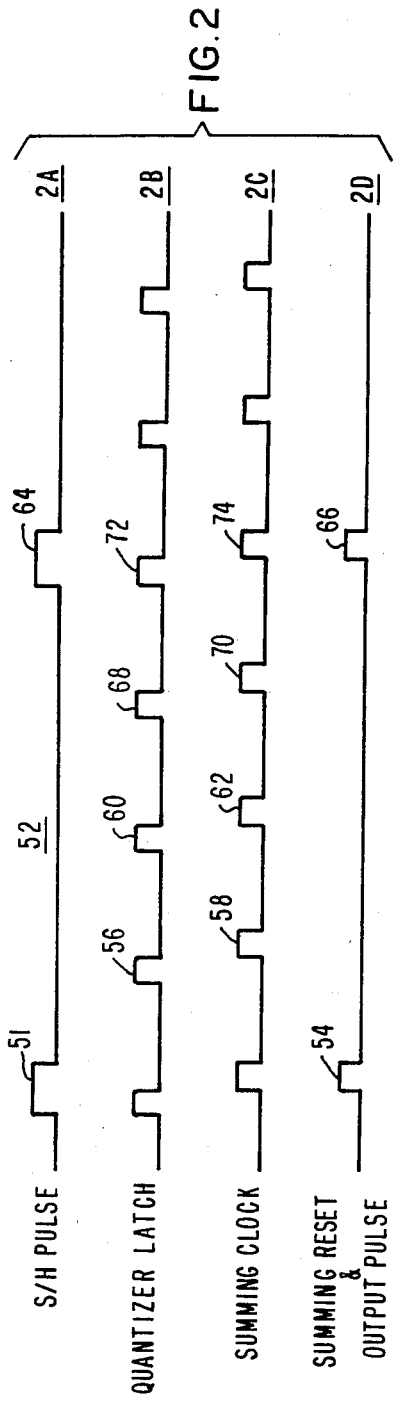

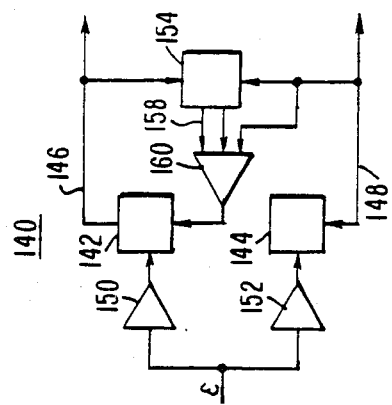

A/D CONVERTER HAVING DIGITALLY CONTROLLED SUBRANGING AND SELF-ALIGNMENT APPARATUS FOR USE THEREIN

BACKGROUND OF THE INVENTION

The present invention relates generally to analog-to-digital converters, and more particularly to a subranging analog-to-digital converter having digitally controlled subranging which eliminates switchable gain and switchable paths in the analog section thereof and further including apparatus for maintaining the prealignment of the various conversion dynamic subranges thereof.

Presently, the need for analog-to-digital converters of 12 or more bits with sample rates in excess of 1 megahertz is increasing, especially for application in such systems as radars and the like. Most converters used for these type applications are falling short of their performance, reliability and manufacturability expectations. The subrange switching and error correction mechanizations of these converters generally appear to be the root of the immediate problems.

Subranging A/D converters rely on an error correction scheme that has very definite and limited tolerance. For the most part, the allowable error is $\pm\frac{1}{2}$ quantum at each successive subrange. Accordingly, if a 4-bit quantizer (i.e. 16 quantum levels) is used for the first subrange, the error correction tolerance is 3.125%, if a 6-bit quantizer is used, the error tolerance is 0.78125%, and if an 8-bit quantizer is used, the error tolerance drops to only 0.195%. A dilemma is thus presented to the designer. If a 4-bit quantizer is chosen to take advantage of the ample error tolerance of 3.125%, 4 subranges are generally required for an A/D converter of 12 or more bits with overlap. This results in a series of cascaded wide band amplifiers, switchable attenuators, offset corrections, and a very difficult circuit layout associated therewith. On the other hand, if a 6-bit quantizer is chosen, only 3 subranges are usually needed and likewise, if an 8-bit quantizer is chosen only 2 subranges are needed. But, in either of the latter cases, the designer must work with even tighter error tolerances.

Moreover, A/D converters having four or more subranges are very often time consuming in the prealignment of the subranges and subsequent test debugging. More often than enough, when a calibration adjustment is made to one subrange, it is necessary to go back over the adjustments of the other subranges due to the high degree of inner reactivity of one subrange to another. Consequently, converter mechanizations having many subranges often fall short of their expectations and produce only marginal results.

In one example, if an overlapping bit error correction scheme is used in an A/D converter, the maximum accumulated error that can be tolerated in any subrange is $\pm\frac{1}{2}$ quantum, that is, the combined errors resulting from all sources cannot exceed one-half quantum. Taking into account all the sources of error, it would only be reasonable to place a tolerance of $\pm\frac{1}{8}$ quantum on the offset and gain errors of a subrange at the time of realignment which is normally performed at room temperature. This would use up 25% of the error correction capacity for offset and gain and allow 75% of the error budget for all the other combined sources of error. In the case of a 4-bit subrange, the calculation of the alignment tolerance for offset and gain match is 0.78%. For each additional bit the error tolerance will half itself, that is, for bits 5, 6, 7 and 8 the error tolerance will be 0.39%, 0.20%, 0.10%, and 0.05%, respectively. These tolerances don't only involve the subrange reference voltages, but also the relative matching of gain and offset between any two adjacent subranges which is of critical concern. The tolerance given above, for each case, is probably too tight for good manufacturability and reproducibility in a production environment. Therefore, some apparatus may be included in each converter to maintain the subranging prealignment over the variations resulting from time and temperature.

SUMMARY OF THE INVENTION

In accordance with the fundamental principles of the present invention, a subranging analog-to-digital converter for converting a sampled analog input signal into corresponding N-bit digital words representative thereof comprises an arithmetic unit, an M-bit quantizer, an accumulating means, and a selecting means. The arithmetic unit generates a series of error signals for each analog input signal sample, the error signals of a series being representative of the differences between a signal representative of the analog input signal sample corresponding thereto and a respectively corresponding series of feedback signals associated therewith. The M-bit quantizer is operative to convert the error signals into corresponding M-bit digital words representative thereof, M-bits being less than N-bits. The accumulating means accumulates each series of M-bit digital word conversions by generating an intermediate accumulated digital word corresponding to each quantizer conversion of a series. Each generated series of intermediate accumulated digital words are respectively representative of the series of feedback signals in accordance with their accumulating sequence. The selecting means selects a final accumulated digital word for each accumulating series of M-bit digital word conversions as the N-bit digital word conversion of its corresponding analog input signal sample.

More specifically, the accumulating means may include means for being reset to an initial state for each analog input sample wherein the initial state is representative of the initial feedback signal of the corresponding series. Also, the converter may include a digital-to-analog converter for converting the intermediate accumulated digital words into corresponding analog signals representing the feedback signals associated therewith. Moreover, the arithmetic unit comprises an analog summing unit for generating the error signals from the corresponding pairs of an analog input signal sample and analog feedback signals related thereto. For the case in which an M-bit digital word is i-bits less than N-bit digital word, the converter includes a means for operating the M-bit quantizer, and accumulating means through a series of at least $2^i$ operations to form the final accumulated N-bit digital word conversion of a corresponding analog input signal sample.

In another aspect of the present invention, the subranging analog-to-digital converter described hereabove may be extended to include a plurality of parallel network branches operating on each error signal simultaneously. Each network branch i of the plurality includes a means for gain adjusting each error signal with a gain $G_i$, and an $M_i$-bit quantizer cascaded therewith for converting each gain adjusted error signal of branch i into an $m_i$-bit digital word representative thereof. The $m_i$ bits of the digital word output of each quantizer i is assigned predeterminately to a portion of the bits of an intermediate n-bit digital word which has a greater bit capacity than any of the $m_i$-bit digital words. Further included in the converter in accordance with this aspect of the present invention is a selecting means which selects at least one digital word conversion from the plurality of simultaneous conversions for each error signal based on the digital codes thereof to form the intermediate N-bit digital word corresponding to each error signal.

More specifically, the gain adjusting means of the network branches include gains which increase progressively from one branch i of the network to another branch i+1 in accordance with a predetermined range of quanta of the corresponding quantizers associated therewith. Furthermore, the selecting means includes a digital gate for each branch of the network except the branch having the lowest gain, each digital gate disposed in cascade with its corresponding branch quantizer and governed by a gate command signal to select the digital word conversion of its corresponding quantizer as a constituent in the formation of the intermediate N-bit digital words in accordance with the bit assignment thereof, and means for generating the gate command signals by generating the gate command signal for the digital gate of branch i+1 based on the conversion digital word code of the quantizer output of branch i.

In still another aspect of the present invention, a subranging analog-to-digital converter includes at least two subranged quantizers operative to each render a subranged digital word conversion of an analog signal input correspondingly gain adjusted, each subranged quantizer having a conversion dynamic range prealigned with the conversion dynamic range of the next higher subranged quantizer to affect a unique set of digital conversion codes of each pair of subranged conversions of the analog signal input value corresponding to the conversion transition region between the pre-aligned subranges, and apparatus for each pre-aligned pair of quantizers for maintaining the conversion dynamic range alignment thereof. The apparatus comprises a first circuit operative to detect an anomaly in the pair of digital conversion codes of the analog signal input value corresponding to the conversion transition region of the pre-aligned quantizer pair and to generate a signal in response to the detected anomalous condition, and a second circuit governed by the generated anomaly signal and the pair of digital conversion codes associated therewith to adjust the conversion dynamic range of at least one of the pair of quantizers in order to ameliorate the anomalous condition.

More specifically, each quantizer may have a reference potential which is adjustable to alter the conversion dynamic range thereof, in which case, the second circuit includes means governed by the generated anomaly signal and the pair of digital codes associated therewith to adjust, at times, a reference potential of at least one of the corresponding pair of quantizers in a direction to ameliorate the anomalous condition.

In still another aspect of the present invention, each subranged quantizer of the pair of subranged quantizers may have a conversion dynamic range pre-aligned with the conversion dynamic range of the next higher subranged quantizer of the pair to affect upper and lower thresholds having unique digital conversion codes of the analog signal input values corresponding to upper and lower conversion transition regions, respectively, between the pre-aligned subranges. Each quantizer has one and another reference potentials which are adjustable to alter the conversion dynamic range thereof. In accordance with this aspect of the present invention, apparatus is included in the converter for each pre-aligned pair of quantizers for maintaining the conversion dynamic range alignment thereof for both gain and offset. This apparatus comprises a first circuit operative to detect an anomaly in the pair of digital conversion codes of the analog signal input value corresponding to the conversion transition region of the upper threshold and to generate a first signal in response to the detected anomalous condition of the upper threshold, a second circuit governed by the generated first signal and the digital conversion codes associated therewith to, at times, adjust the one reference potential of at least one of the pair of quantizers in a direction to ameliorate the anomalous condition of the upper threshold, a third circuit operative to detect an anomaly in the pair of digital conversion codes of the analog signal input value corresponding to the conversion transition region of the lower threshold and to generate a second signal in response to the circuit's anomalous condition of the lower threshold, and a fourth circuit governed by the generated second signal and the digital conversion codes associated therewith to, at times, adjust the other reference potential of at least one of the pair of quantizers in a direction to ameliorate the anomalous condition of the lower threshold.

In a still further aspect of the present invention, the converter includes a quantizer which is time-shared to render multiple subrange digital word conversions of an analog signal input sample, each conversion dynamic subrange prealigned with the next higher conversion dynamic subrange to effect a unique set of digital conversion codes of the analog signal input value corresponding to the conversion transition region between the prealigned subranges, and apparatus for each prealigned pair of subrange conversions for maintaining the conversion dynamic subrange alignment thereof. This apparatus comprises a first circuit operative to compare the pair of subrange conversions of the analog signal input value corresponding to the conversion transition region of the pair to detect an anomaly in the digital conversion codes thereof, and a second circuit governed by the detected anomalous condition and the pair of digital conversion codes associated therewith to adjust at least one of the conversion dynamic subranges of the pair to ameliorate to anomalous conditions. More specifically, the first circuit may include a means for storing the digital conversion code of one of the pair of subrange conversions corresponding to the conversion transition region in order to compare the stored one with the other of the pair to detect an anomaly in the digital conversion codes thereof.

BRIEF DESCRIPTION OF THE DRAWINGS

FIG. 1 is a functional block diagram schematic of a subranging analog-to-digital converter embodying the fundamental principles of one aspect of the present invention;

FIG. 2 depicts the waveforms 2A, 2B, 2C and 2D to exemplify a set of timing signals which are suitable for governing the operation of the A/D converter embodiment of FIG. 1;

FIG. 6 is a functional block diagram schematic of a portion of an analog-to-digital converter for embodying an aspect of the present invention which relates to the alignment of the various subranges thereof;

FIG. 7 is an illustration of the pre-alignment of a pair of conversion dynamic subranges suitable for application to the embodiment of FIG. 6;

DESCRIPTION OF THE PREFERRED EMBODIMENT

Figure 3:
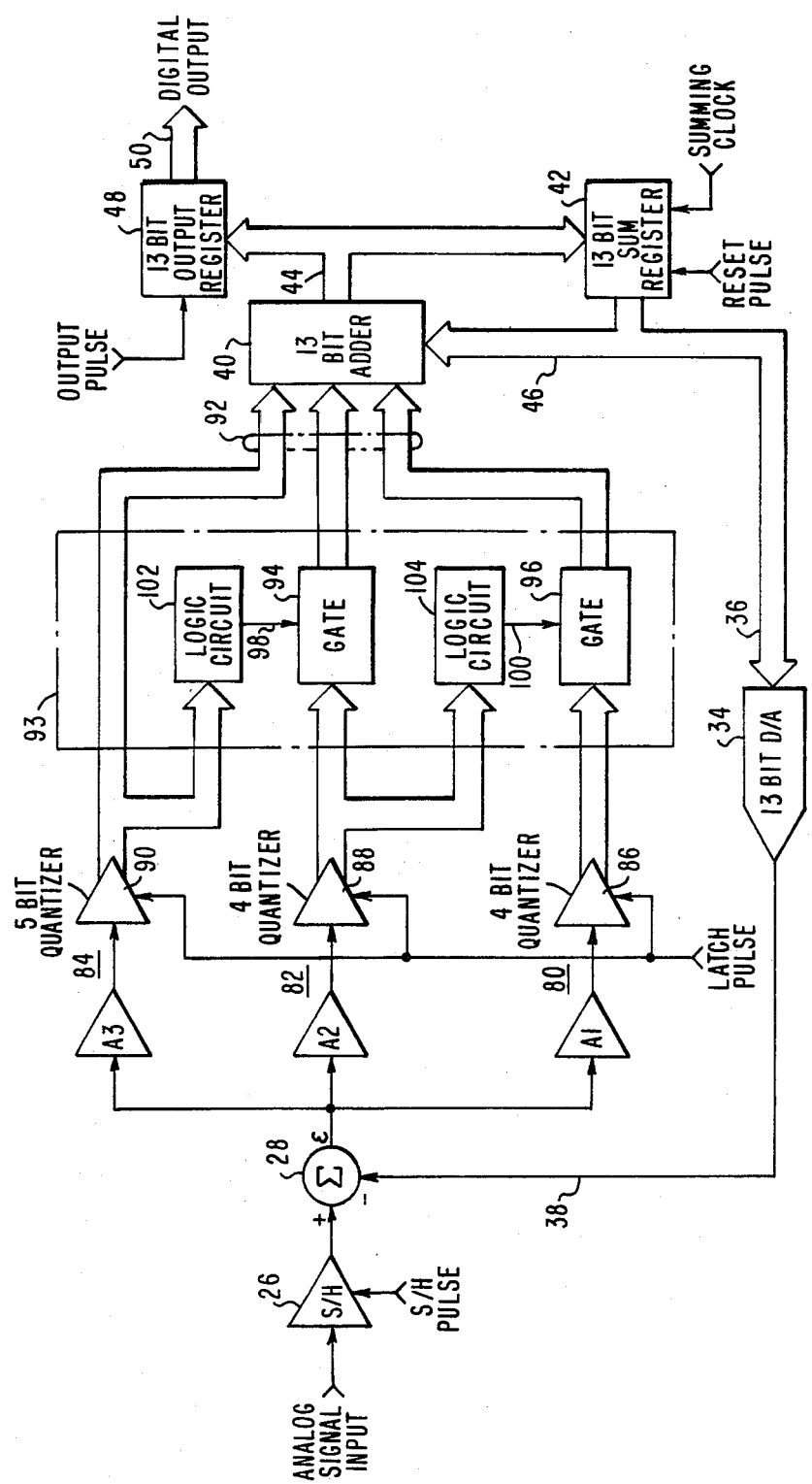
FIG. 3 is a functional block diagram schematic of a subranging A/D converter embodying another aspect of the present invention using the fundamental principles thereof.

A functional block diagram schematic of a subranging analog-to-digital converter (A/D) in accordance with the fundamental principles of one aspect of the present invention is shown in FIG. 1. The embodiment depicted in FIG. 1 may be divided into three basis sections shown outlined by dash dot lines. The basic sections include an analog section 20, a transition section 22 and a digital processing section 24. The analog section 20 may include a sample-and-hold (S/H) circuit 26 for sampling the analog signal input and an arithmetic unit 28 which may be an analog summing network, for example. If necessary, a buffer amplifier (not shown) may be further included. The transition section 22 may include a quantizer 30 for converting the analog error signal $\epsilon$ from the summer 28 to a digital word representative thereof which may be output over the digital lines 32. Further included in section 22 may be a digital-to-analog (D/A) converter for converting a digital word supplied thereto over signal lines 36 into its analog equivalent which is supplied to the summer 28 as an analog feedback signal over signal line 38. The third and final section 24 may include a digital word accumulator comprising, for example, a digital adder 40 and summing register 42. In the present embodiment the output lines 44 of the adder 40 are coupled to the input of the summing register 42 and the stored digital word of the summing register 42 is coupled over signal lines 46 to both the D/A converter 34 and the adder 40. An output register 48 is further included in section 24 to capture the final n-bit digital conversion word representative of the sampled analog signal input.

More specifically, the analog signal input may be coupled to the input of the S/H circuit 26 which has its sampled output coupled to one input of the analog summer 28. The feedback signal from the D/A converter 34 via signal line 38 may be coupled to the other input of the analog summer 28. The error signal $\epsilon$ is coupled to the quantizer 30 which has its conversion digital word output coupled to one input of the digital adder 40 utilizing signal lines 32.

For the purposes of describing an exemplary operation of the subranging A/D converter embodiment depicted in FIG. 1, the quantizer 30 will be considered as having a capacity of only 4 bits, and the digital adder 40, registers 42 and 48 and D/A converter 34 will all be capable of handling up to 5 bits. Furthermore, in connection with the description of operation, it will be assumed that 4 digital timing or clock signals may be conventionally generated in accordance with the waveforms 2A-2D of FIG. 2 to govern the operation of the A/D converter embodiment of FIG. 1. The first of the timing signals, shown in 2A and referred to as the S/H pulse, operates the S/H circuit 26 to sample the analog signal input sample at each pulse thereof. The analog signal input sample may be held at the output of the S/H circuit 26 for the interpulse duration. Each of the pulses of the timing signal of waveform 2B, referred to as the quantizer latch pulse, effects a digital word conversion by the quantizer 30. Each conversion digital word is maintained over the signal lines 32 during the interpulse periods of the waveform 2B. The timing signal of waveform 2C, which is referred to as the summing clock, operates the summing register 42 to capture the digital word from signal lines 44 during the enable pulses thereof for storage therein for the duration of its interpulse periods. Finally, the timing signal of waveform 2D, which is referred to as the summing reset and output pulse, operates with each pulse thereof to reset the summing register 42 to an initial state and to capture the digital word over signal lines 44 in the output register 48 for storage therein during the duration of its interpulse periods. The output register 48 may provide its captured digital words over signal lines 50 as the digital word conversion of its corresponding analog signal input sample.

In operation, the S/H pulse 51 of timing signal 2A may operate the circuit 26 to sample the analog signal input and maintain that level or a signal representative thereof at its output for the duration of the interpulse period 52. Shortly thereafter, the reset pulse 54 of the timing signal 2D may reset the summing register 42 to an initial state, which may be all zeroes for the present embodiment, thus setting the feedback signal over signal line 38 to zero via the signal lines 36 and D/A converter 34. Simultaneously, the previous conversion digital word over digital lines 44 may be stored in output register 48 and provided over the output digital lines 50.

Now with the analog signal input sampled and the feedback signal reset to an initial state which is zero for the present example, the quantizer 30 may be operated to perform its first of a series of digital conversion steps. In the present example, the quantizer 30 has a conversion dynamic range of 4 bits or 16 quanta for each conversion cycle in which case only one of two situations may occur—the error signal $\epsilon$ supplied to the quantizer may be either within the dynamic range of the quantizer or drive the quantizer into saturation. In the event the signal is within the dynamic range, the quantizer 30, after being exercized by the pulse 56 of timing signal 2B, provides an accurate digital word representation of the analog signal ϵ to one input of the digital adder 40. The other input to the adder 40 over signal lines 46 has been reset to zero by the pulse 54 via register 42. Consequently, the conversion digital word over signal lines 32 will pass through the digital adder 40 to the digital lines 44 substantially unchanged.

Next, the pulse 58 of the timing signal 2C captures this first conversion digital word of the series in the summing register 42. Almost instantaneously, the stored digital conversion word is fed back to the analog summer 28 via digital lines 36, D/A converter 34, analog signal line 38 and is also supplied to the other input of the digital adder 40 over signal line 46 to be added to the next conversion digital word in the series.

Assuming an ideal system, the resultant analog error signal from the summer 28 after the first conversion nulls to a level less than 1 quantum. Thus, in response to the next quantizer latch pulse 60, the output of the quantizer 30 provides all zeros over the digital lines 32, in which case, the digital adder 40 passes only the digital word from signal lines 46 to signal lines 44. With the summing clock pulse 62, the same digital conversion word is recirculated through the summing register 42 to the digital adder 40 and D/A converter 44 with no substantial change to the operational status of the system. Furthermore, during the next two pairs of pulses (i.e. 68, 70 and 72, 74) of the combination of timing signals 2B and 2C during the interpulse period 52, this same sequence of operations is traced around the loop as described hereinabove whereupon the same conversion digital word appears two more times over lines 44. The conversion digital word is finally captured in the output register 48 with the pulse 66 and provided over the output digital lines 50 thus allowing for a new series of conversion operations to begin on a new analog signal input sample with the S/H pulse 64.

It is evident that not all of the conversions of the series would be necessary if the analog signal input level was always within the quantum conversion range of the quantizer 30. But, with this example, the aim is to get a 5-bit conversion digital word even through it is beyond the dynamic conversion range of the quantizer 30. For this reason, the description of operation will be repeated for an analog signal input having a level which is more positive than the 4-bit conversion range of the quantizer 30. Accordingly, the analog signal input may be sampled by the pulse 51 and stored at the output of the S/H circuit 26 for the duration of the interpulse period 52 and similarly the summing register 42 may be initially reset to all zeros (i.e. initial state) at the pulse 54. With the conversion pulse 52, the quantizer 30 goes into saturation and provides a digital number consisting of all ones over its output digital lines 32 which in turn is captured into the summing register 42 at the pulse 58 via adder 40. Almost instantaneously thereafter, the analog feedback signal associated therewith is subtracted from the current analog input sample in the summer 28. The resultant analog error signal is now within the conversion dynamic range of the quantizer 30. After the next pair of pulses 60 and 62 of the timing signals 2B and 2C, respectively, the conversion digital word of the quantizer 30 is accumulated in the summing register 42 utilizing the digital adder 40. The intermediate accumulated digital word of the register 42 is resupplied to the digital adder 40 and D/A converter 34. The resultant error signal of the summer 28 should now be within the first quantum range of the quantizer 30. The next two pairs of quantizer latch and summing clock pulses 68, 70 and 72, 74 of the interpulse period 52 should merely recirculate the zero value through the quantizer two more times in a similar fashion as described in the previous example. At the end of the series of quantizations and intermediate accumulations, the final 5-bit conversion digital word is clocked into the output register 48 utilizing the output pulse 66 of the timing signal 2D. Thereafter, a new analog signal input is sampled with the pulse 64 and the sequence of conversion operations is repeated.

It is recognized that up to this point in the description only 2 of the 4 pairs or series of pulses in the interpulse period 52 are used in the conversion process. The conversion digital word representative of the sampled analog signal input appears at the output of the digital adder 40 after only 2 quantizer conversion operations. In fact, in the example in which the analog signal input sample is within the quantizer range, only one quantizer operation is really needed. In the present example, the last two pairs of pulse operations 68, 70 and 72, 74 may serve as error corrections of the subranging embodiment. These error correction operations may correct errors that may result from the analog signal input not settling out during the sampling operation or errors in the quantizer conversions, for example. However, the error correction operations may also be traded for expanded dynamic range of the converter if felt necessary. It is understood that the ultimate accuracy of the converter embodiment as depicted in FIG. 1 is determined by the D/A converter 34, the amplifier circuit 26 and only the first 2 thresholds of the quantizer 30.

If this inventive principle is carried one bit higher to a 6-bit subranging converter, the same 4-bit quantizer 30 may serve to produce the 6-bit A/D conversion. In this case, the D/A converter 34, the digital adder 40, and the registers 42 and 48 are expanded to have a capability of 6 bits each. The only other thing that must be added is that the quantizer incur more conversion operations for each analog signal input sample. From this discussion, it is evident that the number of bits may be theoretically increased to any number of bits using the same 4-bit quantizer. That is, for the general case in which the quantizer has an m-bit capability and a n-bit conversion digital word is desired where n is i bits larger than m, then it would take at least as many as $2^i$ quantization operations for each analog signal input sample to provide a complete conversion to the n-bit digital word desired. Thus, if nothing more is added to the embodiment as depicted in FIG. 1, an exceedingly large number of quantizer operations will be required for each complete conversion, and the conversion time would also become excessive. As for the desirability of a large number of bits at a fast conversion rate, like an A/D converter for over 12 bits at speeds over 1 megahertz, for example, another embodiment maintaining the same principles at that described hereinabove may be desirable.

Referring to FIG. 3, a functional block diagram schematic of an alternate embodiment is shown using the fundamental principles of the present invention as described hereabove to provide a 13-bit conversion digital word representative of its corresponding analog signal input sample. The embodiment shown in FIG. 3 is similar to the embodiment of FIG. 1 in that it includes a sample-and-hold circuit 26, summer 28, D/A converter 34, digital adder 40, and summing and output registers 42 and 48, respectively. The digital components 34, 40, 42 and 48 have all been extended to have a 13-bit capacity in their conversion, addition and storage capabilities. Furthermore, the embodiment of FIG. 3 has been expanded to include a plurality of parallel network branches 80, 82 and 84 for operating on each error signal $\epsilon$ simultaneously. The network branches 80, 82 and 84 each contain an amplifier A1, A2 and A3, respectively, for gain adjusting the error signal $\epsilon$ with an appropriately chosen gain. For the present embodiment the gains of the amplifiers A1, A2 and A3 increase progressively from one branch of the network to another in accordance with a predetermined range or quanta of their corresponding quantizers. For the embodiment the gains of the amplifiers A3, A2 and A1 may be in proportion to 1/256, 1/16, and 1, respectively.

Moreover, each parallel network branch 80, 82 and 84 may include a quantizer 86, 88 and 90, respectively, in cascade with each corresponding gain adjusting amplifier. Each quantizer 86, 88 and 90 may be chosen to have a bit capacity for converting its corresponding gain adjusted error signal into an m-bit digital word representative thereof, the m-bits of the digital word output of each quantizer 86, 88 and 90 may be assigned predeterminately to a portion of the bits of an intermediate n-bit digital word 92 which is formed at one input of the digital adder 40. The n-bit digital word has a greater bit capacity than any of the m-bit digital words of the quantizers 86, 88 and 90. For the present embodiment, the quantizers 86, 88 and 90 are chosen to have conversion capacities of 4-bit, 4-bit, and 5-bit, respectively.

Also included in the embodiment of FIG. 3 is a circuit 93 for selecting at least one digital word conversion from the plurality of simultaneous conversions for each error signal based on the digital codes thereof to form the intermediate n-bit digital word 92 corresponding to each error signal. More specifically, except for the branch 84 having the lowest gain A3, digital gates 94 and 96 are disposed at each of the other branches 82 and 80, respectively, in cascade with its corresponding branch quantizer. The gates 94 and 96 are governed by corresponding gate command signals 98 and 100 to select the digital word conversion of its corresponding quantizer as a constituent in the formation of the intermediate n-bit digital words 92 in accordance with the bit assignment thereof. The gate command signal 98 for the gate 94 of the branch 82 is generated by a logic circuit 102 in accordance with the output digital word code of the quantizer 90 of the branch 84. Likewise, the gate command signal 100 for the digital gate 96 of the branch 80 is generated by the logic circuit 104 in accordance with the digital word code of the quantizer 88 of the branch 82. In general, it may be stated that the gate command signal for the digital gates of a branch i+1 is based on the digital word code of the quantizer output of a branch i.

The 4-bit quantizers 86 and 88 of the embodiment of FIG. 3 may be implemented with off-the-shelf quantizers of the type having a model number AMD6688 manufactured by Advanced Micro Devices, Inc. The 5-bit quantizer 90 may be implemented with two such 4-bit quantizers in a conventional manner so as to create the 5-bit capacity thereof. The other analog and digital components of the embodiment are generally well known elements to anyone skilled in the pertinent art and are not considered by themselves to be part of the present invention, therefore further descriptive detail of these elements is not felt necessary. The logic circuits 102 and 104 may be of a conventional decoder design focusing on a particular code or combination of codes in the generation of the respective gate command signals 98 and 100.

The embodiment of FIG. 3 is similar in operational principles as that described in connection with the embodiment of FIG. 1 except that it is not limited to reducing each quantizer operation to only the 16 quanta of the one quantizer (refer to quantizer 30 of FIG. 1). Because of the similarity in operation between the two embodiments, the same timing waveforms 2A–2D as depicted in FIG. 2 may be used in the description of operation of the embodiment of FIG. 3.

In operation, the analog signal input may be sampled by the S/H circuit 26 in accordance with the S/H pulses of the timing signal 2A. An analog signal input sample may be held at the output of the circuit 26 or input of the analog summer 28 for the duration of the interpulse period 52. Likewise, in the conversion of each analog signal sample, there will be provided a series of feedback signals correspondingly associated with the quantizer and register storage operations performed in accordance with the pairs of pulses of timing signals 2B and 2C and including the initial reset state of the register 42 in connection with the reset pulse 54 of waveform 2D. Accordingly, a series of error signals $\epsilon$ are generated at the output of the analog summer 28 respectively corresponding to the series of feedback signals associated with each analog signal sample.

Each analog error signal $\epsilon$ of the series is operated on, preferably simultaneously, in the plurality of parallel network branches 80, 82 and 84 to eventually form an intermediate n-bit conversion digital word 92 corresponding thereto. The summing register 42 may be initially set to an initial state, preferably all zeroes, providing for an initial analog feedback signal of the series over signal line 38 being the analog equivalent thereof. In addition, the initial state of all zeroes is provided to the other input of the digital adder 40 over signal lines 46. Thereafter, the summing register 42 is used to accumulate the summations of the digital adder 40, thus accumulating each series of formed intermediate n-bit digital words by generating an intermediate accumulated n-bit digital word corresponding to each formed intermediate n-bit digital word of a series. The generated series of intermediate accumulated n-bit digital words output from the summing register 42 over signal lines 36 to the D/A converter 34 becomes respectively the representative series of feedback signals in accordance with the accumulating sequence thereof. At the end of each series of quantizer conversions, the final accumulated n-bit digital word for each accumulating series of formed intermediate n-bit digital words is captured in the storage register 48 and provided to the output lines 50 as the n-bit digital word conversion of its corresponding analog input signal sample.

More specifically, if the analog error signal falls within the 4-bit range of quantizer 86, only one quantizer operation is needed and the remaining conversions of the series simply render the same intermediate accumulated n-bit digital word to be recirculated in the series of feedback signals. The other quantizers 88 and 90 covering the higher order of bits of the intermediate n-bit word are not used.

On the other hand, if the analog error signal falls within the range of the quantizer 90, which may have its conversion digital word assigned to the higher order bits 9 through 13 of the formed 13-bit word 92, for example, the other two quantizers 86 and 88 go into saturation. In accordance with the conversion digital word codes of quantizers 90 and 88, logic circuits 102 and 104 generate the command signals 98 and 100 which block the conversion digital words of the quantizers 86 and 88 in the formation of the n-bit word 92 with the digital gates 96 and 94, respectively. Thus, the five most significant bits 9-13 of the formed n-bit intermediate digital word 92 are determined with the operation of the quantizer 90 in accordance with the pulse 56, for example, of the timing signal 2B. With a pulse 58 of the timing signal 2C, the formed n-bit word 92 including the five most significant bits is stored in the summing register 42 as an intermediate accumulated digital word of the series and almost instantaneously therewith, the analog equivalent thereof is subtracted from the current analog signal input sample in the summer 28 via signal lines 36, D/A converter 34 and signal line 38 to effect the next analog error signal of the series. This intermediate accumulated digital word is also provided to the other input of the digital adder 40 over signal lines 46.

The next analog error signal of the series is most likely to fall within the range of the quantizer 88 which has its conversion digital word bits assigned to bits 5 through 8 of the formed n-bit digital word 92 in the present embodiment. This being the case, with the next quantizer pulse 60 of the series, the quantizer 90 provides all zeros at its output and the quantizer 86 goes into saturation. In accordance with the conversion code of quantizer 90, the logic circuit 102 generates a gate command signal 98 to enable the digital gate 94 to allow the conversion digital word of quantizer 88 to become a constituent portion in the formation of the 13-bit intermediate digital word 92. However, because of the conversion code of quantizer 88, the logic circuit 104 generates a gate command signal 100 to inhibit the gate 96 thus blocking the conversion digital word output of quantizer 86 from passing through to its assigned portion of the formed n-bit digital word 92. The digital adder 40 adds the newly formed intermediate digital word 92 to the old intermediate accumulated digital word supplied over lines 46 to form a new intermediate accumulated digital word which is captured in the summing register 42 with the summing clock pulse 62. Thus, a new feedback signal of the series is supplied to the summer 28 and a new intermediate accumulated word is supplied to the other input of the digital adder 40 via lines 46.

The next error signal of the series is most likely to fall within the range of the lowest order quantizer 86 which has its conversion digital word bits assigned to bits 1 through 4 of the 13-bit formed digital word 92. Upon the arrival of the next conversion pulse 68, the quantizers are commanded to digitize their corresponding gain-adjusted analog error signal, preferably simultaneously. As a result of this third quantizer conversion cycle, the output conversion digital words of quantizers 88 and 90 are expected to be all zeros. Accordingly, the logic circuits 102 and 104 respond to the digital codes of the conversion words of quantizers 88 and 90 to enable their corresponding gate 94 and 96 to allow passage of the conversion digital words of quantizers 88 and 86 to their assigned portions in the formed intermediate digital word 92. The digital adder 40 once again adds the digital words supplied to its inputs to form a new intermediate accumulated digital word which is stored in the summing register 42 upon the next summing clock pulse 70. For all practical purposes, the analog-to-digital conversion cycle is completed at this time leaving the remaining operational steps of the series for error corrections. The final accumulated 13-bit digital word is thereafter stored in the output register 48 with the pulse 66 and provided over the output digital lines 50 as the 13-bit digital word conversion of its corresponding analog signal input sample. Another sample is selected with the pulse 64, for example, and the conversion process is repeated.

The embodiment described hereabove in connection with the block diagram schematic of FIG. 3 assumes that there is never a negative analog error signal $\epsilon$. This may be assured by introducing a small offset at some convenient point in the circuitry or by slowing down the analog path slightly for the two quantizers 88 and 90 covering the higher order bits in the formed intermediate digital word 92. However, it is understood that the principles of the present invention may be expanded to embody the ability to process negative analog signal errors $\epsilon$. This may be accomplished in a simple manner by adding one more 4-bit quantizer to the lowest order quantizer 86 so as to make the sub-range associated therewith expand to plus or minus four bits. Thus, an error of sixteen quanta in the negative direction may be tolerated. It is understood, that there may be many embodiment variations that may accomplish the ability to process negative analog signal errors. Two such alternate embodiments are shown in block diagram schematic form in FIGS. 4 and 5.

Figure 4:
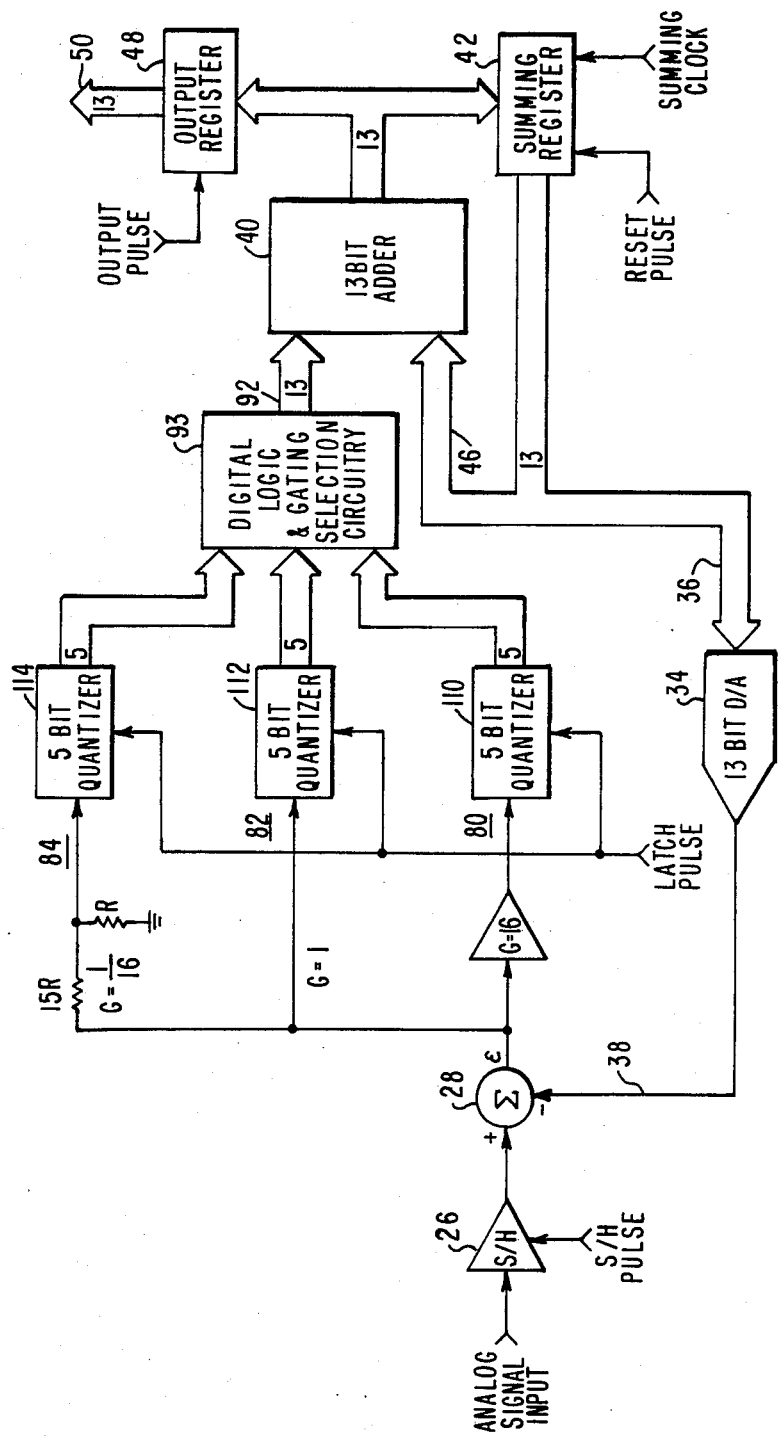
FIG. 4 is a functional block diagram schematic of a subranging A/D converter embodying another aspect of the present invention.

In the embodiment of FIG. 4, each of the branch quantizers 110, 112 and 114 of the branches 80, 82 and 84, respectively, may be implemented with two 4-bit quantizers which may be of the type having a model No. AMD6688 configured for bipolar conversion operation to render a 5-bit 2's complement conversion digital word. The 5-bit conversion digital words of the branch quantizers 110, 112 and 114 are each provided to the selecting circuitry 93 which, in turn, selects at least one of the digital word conversions from the plurality of simultaneous conversions for each error signal $\epsilon$ based on the digital codes thereof to form the intermediate 13-bit digital word 92 corresponding to each error signal $\epsilon$. The corresponding gain adjustments for the network branches 84, 82 and 80 may have gains proportional to 1/16, 1 and 16, respectively, and the formed intermediate and intermediate and final accumulated digital words in the present embodiment each have a capacity of 13 bits.

More specifically, with regard to the selection of circuitry 93, the conversion digital word of the quantizer 114 passes through the selection circuitry 93 with the most significant bit assigned to the most significant bit of the formed n-bit intermediate digital word input to the digital adder 40 and the other four bits assigned into bits 2 through 5 with the least significant bit going to bit 5 of the formed intermediate n-bit digital word 92. In addition, the conversion digital word of quantizer 112 passes through the selection circuitry 93 with the most significant bit thereof logically "or"ed to bits 1 through 5 of the intermediate n-bit word 92 and the other four bits being gated and assigned to bits 6 through 9 with the least significant bit going to bit 9 of the intermediate n-bit word 92. Furthermore, the conversion digital word of the quantizer 110 passes through the selection circuitry 93 with the most significant bit thereof logically "or"ed to bits 1 through 9 in the formation of the intermediate n-bit word 92 with the other four bits being gated and assigned to bits 10 through 13 of the formed intermediate n-bit digital word 92. The embodiment thus provides a 1-bit overlap of quantizer sub-ranges which is a conventional technique of most present A/D converters.

The overlapping bit of the present embodiment offers the same error correction ability as that of the present converters in addition to the extra error-correcting quantizer operations afforded by the principles of the present invention. Thus, the error-correction capabilities of the described embodiment are compatible with error correction capabilities of the overlapping bit technique conventionally used. Moreover, using the overlapping bit between sub-ranges ensures that the conversion unit may be aligned to complete the conversion in three quantizer operations as described hereabove at the time of initial pre-alignment. Therefore, the remainder of the quantizer operations whatever they may be determined to be may repeat conversions by any of the three sub-ranges of the above-described embodiments as needed to correct errors that may have developed as a result of aging and temperature variations. The chief features of the above A/D subranging converter embodiments are that they provide for simplified analog circuits, automatic digital sub-range selection, and compatibility with conventional overlapping bit error-correction techniques. In addition, there is no need for D.C. potential offset or switching circuits that generally provide complications.

More particularly, with regard to the embodiment described in connection with FIG. 4, the selection circuitry 93 is configured such that the highest order quantizer showing activity above numerals 00000 or below numerals 11111 (2's complement code) may be automatically selected for processing. In this manner, the largest analog signal error range may be always selected regardless of which quantizer is being operated. For example, if the analog signal error ε has a value which falls in the highest order quantizer range, the conversion digital word of the highest order quantizer is selected and the conversion digital words of the lower order quantizers are inhibited or blocked from becoming a constituent of the formed intermediate n-bit digital word 92. With the feedback signal converted from the intermediate accumulated digital word stored in the summing register 42, the next analog signal error is reduced to within the next lower subranged quantizer (i.e. quantizer 112) and the conversion word thereof is most likely to be the candidate for the next selection. And finally, for the third of the series of quantizer operations, the lowest subranged quantizer 110 is most likely to provide the conversion word for selection by the selection circuitry 93 in the formation of the small n-bit intermediate digital word 92.

But, should the A/D subranging converter become slightly misaligned for some reason and the highest order quantizer operation does not quite reduce the analog signal error to within the range of the lower subranged quantizer 112, the conversion digital word of the highest order quantizer 114 will again be selected until the analog signal error is reduced to within the next lower sub-range. The conversion cycles may be continued with the remaining quantizer operations of the series. It is also noted that if the analog signal error falls within the lowest order sub-range of quantizer 110, the two higher order quantizers 112 and 114 are not used and the conversion process may be most likely completed in one conversion cycle leaving the whatever additional conversion cycles there are in the series for error correction.

In the embodiment described in connection with FIG. 4, the conversion digital word outputs of each of the subranging quantizers 110, 112 and 114 may be centered about the dynamic range thereof. This may be accomplished by "or" gating the most significant bit of each of the sub-ranges to all of the higher significant bits as described hereabove. Typical truth tables of the conversion digital word outputs of the sub-range quantizers in the formation of the 13-bit digital word 92 are provided in Tables 1, 2 and 3 herebelow. As a result of this logical configuration, the full digitized error may always be added or subtracted in the digital adder 40. The digital addition or subtraction is limited only by the bit capacity of the selected processing chips and the digital number coming from each quantizer.

TABLE 1

| | | | | | | | | | | sign | bit | | | Quantum |
|---|---|---|---|---|---|---|---|---|---|---|---|---|---|---|
| BIT | 1 | 2 | 3 | 4 | 5 | 6 | 7 | 8 | 9 | 10 | 11 | 12 | 13 | Value |
| | 0 | 0 | 0 | 0 | 0 | 0 | 0 | 0 | 0 | 1 | 1 | 1 | 1 | 15 |
| | 0 | 0 | 0 | 0 | 0 | 0 | 0 | 0 | 0 | 1 | 1 | 1 | 0 | 14 |
| | 0 | 0 | 0 | 0 | 0 | 0 | 0 | 0 | 0 | 1 | 1 | 0 | 1 | 13 |
| | 0 | 0 | 0 | 0 | 0 | 0 | 0 | 0 | 0 | 1 | 1 | 0 | 0 | 12 |
| | 0 | 0 | 0 | 0 | 0 | 0 | 0 | 0 | 0 | 1 | 0 | 1 | 1 | 11 |
| | 0 | 0 | 0 | 0 | 0 | 0 | 0 | 0 | 0 | 1 | 0 | 1 | 0 | 10 |
| | 0 | 0 | 0 | 0 | 0 | 0 | 0 | 0 | 0 | 1 | 0 | 0 | 1 | 9 |
| | 0 | 0 | 0 | 0 | 0 | 0 | 0 | 0 | 0 | 1 | 0 | 0 | 0 | 8 |
| | 0 | 0 | 0 | 0 | 0 | 0 | 0 | 0 | 0 | 0 | 1 | 1 | 1 | 7 |
| | 0 | 0 | 0 | 0 | 0 | 0 | 0 | 0 | 0 | 0 | 1 | 1 | 0 | 6 |
| | 0 | 0 | 0 | 0 | 0 | 0 | 0 | 0 | 0 | 0 | 1 | 0 | 1 | 5 |
| | 0 | 0 | 0 | 0 | 0 | 0 | 0 | 0 | 0 | 0 | 1 | 0 | 0 | 4 |
| | 0 | 0 | 0 | 0 | 0 | 0 | 0 | 0 | 0 | 0 | 0 | 1 | 1 | 3 |
| | 0 | 0 | 0 | 0 | 0 | 0 | 0 | 0 | 0 | 0 | 0 | 1 | 0 | 2 |
| | 0 | 0 | 0 | 0 | 0 | 0 | 0 | 0 | 0 | 0 | 0 | 0 | 1 | 1 |
| | 0 | 0 | 0 | 0 | 0 | 0 | 0 | 0 | 0 | 0 | 0 | 0 | 0 | 0 |
| | 1 | 1 | 1 | 1 | 1 | 1 | 1 | 1 | 1 | 1 | 1 | 1 | 1 | −1 |
| | 1 | 1 | 1 | 1 | 1 | 1 | 1 | 1 | 1 | 1 | 1 | 1 | 0 | −2 |
| | 1 | 1 | 1 | 1 | 1 | 1 | 1 | 1 | 1 | 1 | 1 | 0 | 1 | −3 |
| | 1 | 1 | 1 | 1 | 1 | 1 | 1 | 1 | 1 | 1 | 1 | 0 | 0 | −4 |
| | 1 | 1 | 1 | 1 | 1 | 1 | 1 | 1 | 1 | 1 | 0 | 1 | 1 | −5 |
| | 1 | 1 | 1 | 1 | 1 | 1 | 1 | 1 | 1 | 1 | 0 | 1 | 0 | −6 |
| | 1 | 1 | 1 | 1 | 1 | 1 | 1 | 1 | 1 | 1 | 0 | 0 | 1 | −7 |
| | 1 | 1 | 1 | 1 | 1 | 1 | 1 | 1 | 1 | 1 | 0 | 0 | 0 | −8 |
| | 1 | 1 | 1 | 1 | 1 | 1 | 1 | 1 | 1 | 0 | 1 | 1 | 1 | −9 |

TABLE 1-continued

Lowest Order Quantizer Truth Table

| BIT | 1 | 2 | 3 | 4 | 5 | 6 | 7 | 8 | ↓ 9 | sign 10 | bit 11 | 12 | 13 | Quantum Value |
|---|---|---|---|---|---|---|---|---|---|---|---|---|---|---|
| | 1 | 1 | 1 | 1 | 1 | 1 | 1 | 1 | 1 | 0 | 1 | 1 | 0 | −10 |
| | 1 | 1 | 1 | 1 | 1 | 1 | 1 | 1 | 1 | 0 | 1 | 0 | 1 | −11 |
| | 1 | 1 | 1 | 1 | 1 | 1 | 1 | 1 | 1 | 0 | 1 | 0 | 0 | −12 |
| | 1 | 1 | 1 | 1 | 1 | 1 | 1 | 1 | 1 | 0 | 0 | 1 | 1 | −13 |
| | 1 | 1 | 1 | 1 | 1 | 1 | 1 | 1 | 1 | 0 | 0 | 1 | 0 | −14 |
| | 1 | 1 | 1 | 1 | 1 | 1 | 1 | 1 | 1 | 0 | 0 | 0 | 1 | −15 |
| | 1 | 1 | 1 | 1 | 1 | 1 | 1 | 1 | 1 | 0 | 0 | 0 | 0 | −16 |

TABLE 2

Mid-Range Quantizer Truth Table

| BIT | 1 | 2 | 3 | 4 | ↓ 5 | sign 6 | bit 7 | 8 | 9 | Quantum Value |
|---|---|---|---|---|---|---|---|---|---|---|
| | 0 | 0 | 0 | 0 | 0 | 1 | 1 | 1 | 1 | 240 |
| | 0 | 0 | 0 | 0 | 0 | 1 | 1 | 1 | 0 | 224 |
| | 0 | 0 | 0 | 0 | 0 | 1 | 1 | 0 | 1 | 208 |
| | 0 | 0 | 0 | 0 | 0 | 1 | 1 | 0 | 0 | 192 |
| | 0 | 0 | 0 | 0 | 0 | 1 | 0 | 1 | 1 | 176 |
| | 0 | 0 | 0 | 0 | 0 | 1 | 0 | 1 | 0 | 160 |
| | 0 | 0 | 0 | 0 | 0 | 1 | 0 | 0 | 1 | 144 |
| | 0 | 0 | 0 | 0 | 0 | 1 | 0 | 0 | 0 | 128 |
| | 0 | 0 | 0 | 0 | 0 | 0 | 1 | 1 | 1 | 112 |
| | 0 | 0 | 0 | 0 | 0 | 0 | 1 | 1 | 0 | 96 |
| | 0 | 0 | 0 | 0 | 0 | 0 | 1 | 0 | 1 | 80 |
| | 0 | 0 | 0 | 0 | 0 | 0 | 1 | 0 | 0 | 64 |
| | 0 | 0 | 0 | 0 | 0 | 0 | 0 | 1 | 1 | 48 |
| | 0 | 0 | 0 | 0 | 0 | 0 | 0 | 1 | 0 | 32 |
| | 0 | 0 | 0 | 0 | 0 | 0 | 0 | 0 | 1 | 16 |
| | 0 | 0 | 0 | 0 | 0 | 0 | 0 | 0 | 0 | 0 |
| | 1 | 1 | 1 | 1 | 1 | 1 | 1 | 1 | 1 | −16 |
| | 1 | 1 | 1 | 1 | 1 | 1 | 1 | 1 | 0 | −32 |
| | 1 | 1 | 1 | 1 | 1 | 1 | 1 | 0 | 1 | −48 |
| | 1 | 1 | 1 | 1 | 1 | 1 | 1 | 0 | 0 | −64 |
| | 1 | 1 | 1 | 1 | 1 | 1 | 0 | 1 | 1 | −80 |
| | 1 | 1 | 1 | 1 | 1 | 1 | 0 | 1 | 0 | −96 |
| | 1 | 1 | 1 | 1 | 1 | 1 | 0 | 0 | 1 | −112 |
| | 1 | 1 | 1 | 1 | 1 | 1 | 0 | 0 | 0 | −128 |
| | 1 | 1 | 1 | 1 | 1 | 0 | 1 | 1 | 1 | −144 |
| | 1 | 1 | 1 | 1 | 1 | 0 | 1 | 1 | 0 | −160 |
| | 1 | 1 | 1 | 1 | 1 | 0 | 1 | 0 | 1 | −176 |
| | 1 | 1 | 1 | 1 | 1 | 0 | 1 | 0 | 0 | −192 |
| | 1 | 1 | 1 | 1 | 1 | 0 | 0 | 1 | 1 | −208 |
| | 1 | 1 | 1 | 1 | 1 | 0 | 0 | 1 | 0 | −224 |
| | 1 | 1 | 1 | 1 | 1 | 0 | 0 | 0 | 1 | −240 |
| | 1 | 1 | 1 | 1 | 1 | 0 | 0 | 0 | 0 | −256 |

TABLE 3

Highest Quantizer Order Truth Table

| BIT | ↓ 1 | sign 2 | bit 3 | 4 | 5 | Quantum Value |
|---|---|---|---|---|---|---|
| | 0 | 1 | 1 | 1 | 1 | 3840 |
| | 0 | 1 | 1 | 1 | 0 | 3584 |
| | 0 | 1 | 1 | 0 | 1 | 3328 |
| | 0 | 1 | 1 | 0 | 0 | 3072 |
| | 0 | 1 | 0 | 1 | 1 | 2816 |
| | 0 | 1 | 0 | 1 | 0 | 2560 |
| | 0 | 1 | 0 | 0 | 1 | 2304 |
| | 0 | 1 | 0 | 0 | 0 | 2048 |
| | 0 | 0 | 1 | 1 | 1 | 1792 |
| | 0 | 0 | 1 | 1 | 0 | 1536 |
| | 0 | 0 | 1 | 0 | 1 | 1280 |
| | 0 | 0 | 1 | 0 | 0 | 1024 |
| | 0 | 0 | 0 | 1 | 1 | 768 |
| | 0 | 0 | 0 | 1 | 0 | 512 |
| | 0 | 0 | 0 | 0 | 1 | 256 |
| | 0 | 0 | 0 | 0 | 0 | 0 |
| | 1 | 1 | 1 | 1 | 1 | −256 |
| | 1 | 1 | 1 | 1 | 0 | −512 |
| | 1 | 1 | 1 | 0 | 1 | −768 |
| | 1 | 1 | 1 | 0 | 0 | −1024 |
| | 1 | 1 | 0 | 1 | 1 | −1280 |
| | 1 | 1 | 0 | 1 | 0 | −1536 |
| | 1 | 1 | 0 | 0 | 1 | −1792 |
| | 1 | 1 | 0 | 0 | 0 | −2048 |
| | 1 | 0 | 1 | 1 | 1 | −2304 |
| | 1 | 0 | 1 | 1 | 0 | −2560 |
| | 1 | 0 | 1 | 0 | 1 | −2816 |
| | 1 | 0 | 1 | 0 | 0 | −3072 |
| | 1 | 0 | 0 | 1 | 1 | −3328 |
| | 1 | 0 | 0 | 1 | 0 | −3584 |
| | 1 | 0 | 0 | 0 | 1 | −3840 |
| | 1 | 0 | 0 | 0 | 0 | −4096 |

Another difference between the unipolar and bipolar embodiments of FIGS. 3 and 4, respectively, is that in the bipolar converter, the summing register 42 is reset to an initial state, preferably the mid-range of the bipolar range of the converter, at the beginning of each conversion series and that the D/A converter 34 is configured for bipolar operation. The mid-range digital code is generally all zeros converting into a mid-range feedback signal of zero voltage potential via the D/A converter 34. It is evident then that after the first quantizer operation, the analog signal error as a result of the feedback may be either positive or negative with an amplitude of up to one-half of the full dynamic range of the converter. The operational principles of the bipolar converter are the same as that discussed in connection with the unipolar embodiment of FIG. 3 except that the bipolar embodiment of FIG. 4 now has the capacity to correct errors in either the positive or negative direction. As has been discussed above, should the analog signal error be quite small, falling within the sub-range of the lowest order quantizer 110, the first quantizer operation will most likely correct the error leaving the remaining quantizer operations of the series to assure accuracy. For a full range positive or negative analog signal input sample, three quantizer operations will be required for the bipolar embodiment of FIG. 4 leaving a predetermined additional number of additional quantizer operations in the series to assure accuracy as was described in connection with the timing signals of FIG. 2.

It is understood that there will always be trade-offs to be considered in the design of any mechanization embodying the principles of the present invention. For instance, five quantizer operations have been suggested for each series in the conversion of an analog signal input sample for the embodiment described in connection with FIG. 4 (i.e. 2 additional conversions for error correction), but with the use of high-speed ECL logic and the quality of D/A converters presently available, six quantizer operations may offer a better solution (i.e. 3 additional conversions for error correction). Another variation may be to speed up the quantizer operations at the beginning of a conversion series allowing less time for the higher order quantizers and slow down the quantizer operations toward the end of a conversion series allowing more settling time for the lower order quantizers where the accuracy is needed. In the present embodiment, the A/D converter is made even less critical to alignment by overlapping the quantizer subranges. Also, while more 4-bit quantizers are needed in the bipolar embodiment of FIG. 5 to expand the range of each quantizer to five bits instead of four bits (i.e. 2's complement), additional analog amplifiers or analog paths are not required.

Figure 5:
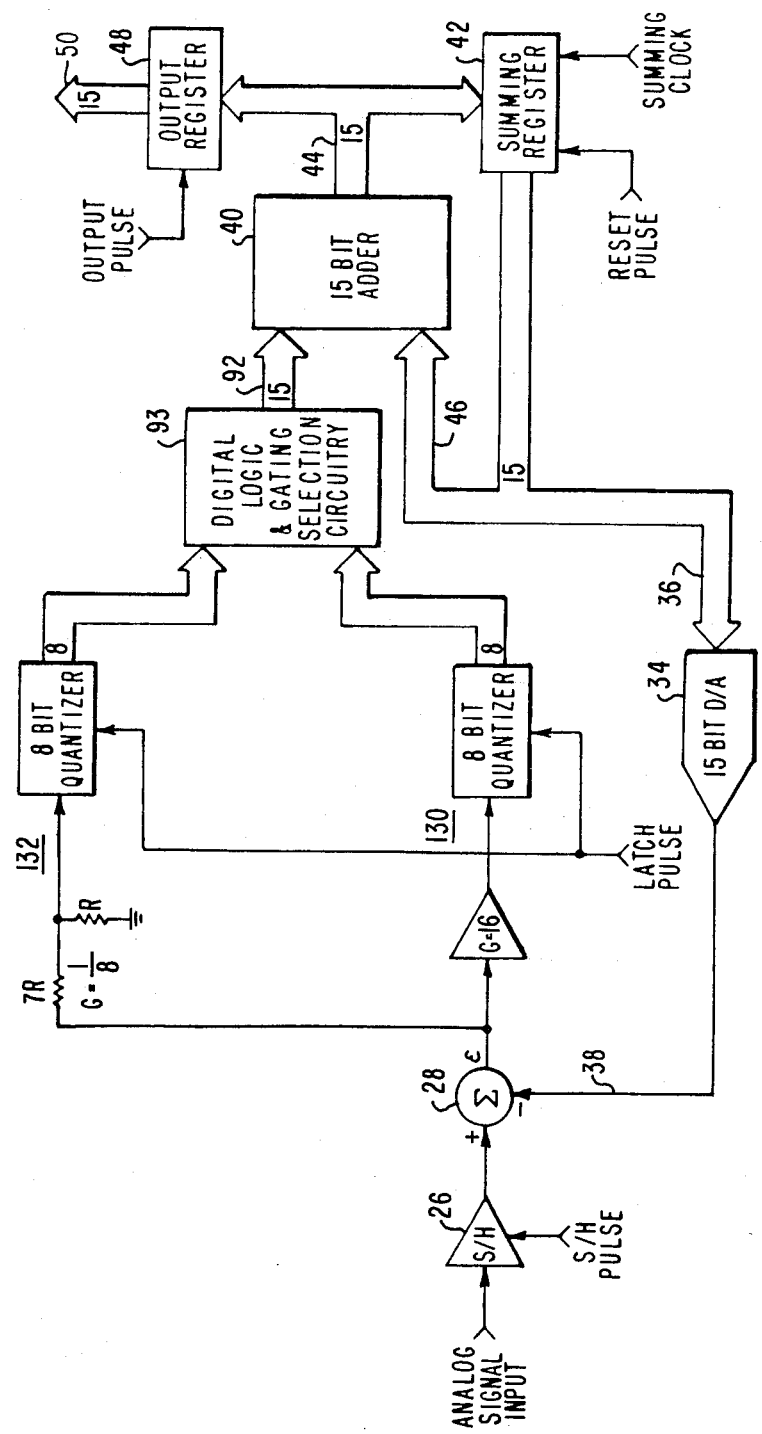
FIG. 5 is a functional block diagram schematic of a subranging A/D converter for alternately embodying the another aspect of the present invention.

In still another alternate embodiment, quantizers having a greater bit capacity may be used such as quantizers of the 8-bit type similar to the model No. TDC1025-L1C, manufactured by TRW, Inc., for example. A block diagram functional schematic of this alternate embodiment is shown in FIG. 5 and includes only two network brances 130 and 132 having corresponding gain adjustment circuits proportional to sixteen and one-eighth, respectively. In this embodiment, the formed intermediate and intermediate and final accumulated digital words each have a capacity of fifteen bits and, accordingly, the digital elements associated with the conversion and formation of the aforementioned words have a capacity of fifteen bits. Some advantages of the embodiment of FIG. 5 include an increase in the number of bits of the conversion digital words up to fifteen bits with a reduced number of quantizer operations. However, while the increased number of conversion bits is a benefit, it has to be taken into consideration with the high cost of the 8-bit quantizer models and the need for a double-quantizer conversion latch pulse for each quantizer operation due to the unique design thereof.

Another aspect of the present invention relates to the alignment of the various subranges of a sub-ranging analog-to-digital (A/D) converter. Referring to FIG. 6, a subranging A/D converter 140 may include at least two subranged quantizers 142 and 144 operative to each render a subranged digital word conversion 146 and 148, respectively, of an analog error signal ε correspondingly gain-adjusted by respective amplifiers 150 and 152. Each subranged quantizer 142 may have a conversion dynamic range pre-aligned with the conversion dynamic range of the next higher subranged quantizer 144 to effect a unique set of digital conversion codes of each pair of subrange conversions of the analog signal input value corresponding to the conversion transition region between the pre-aligned subranges.

In accordance with this aspect of the present invention, apparatus 154/160 is included for each prealigned pair of quantizers 142 and 144 for maintaining the conversion dynamic range alignment thereof. For convenience, the quantizers 142 and 144 of the embodiment depicted in FIG. 6 are assumed to comprise the conversion dynamic subranges of three bits each with no overlapping bit in the formation of the intermediate 6-bit digital word. It is additionally assumed that the two separate parallel quantizers 142 and 144 allow for the conversion digital words thereof to be available during each quantizer operation. It is understood that these conditions are not necessary, but they help to simplify the description substantially.

Referring to FIG. 7, in the pre-alignment of the conversion dynamic ranges of the two quantizers 142 and 144, a set of digital conversion codes is effected for the analog signal input value corresponding to a conversion transition region between the pre-aligned subranges. For this 3-bit example, a transition region is established around the first level denoted by 156 of the higher conversion dynamic subrange. The respective set of codes for the high and low subranges at the transition 156 are, for the particular example, 000 and 111 below the threshold 156, and 001 and 000 above the threshold 156.

With regard to the embodiment of FIG. 6, the alignment maintaining apparatus may include a first circuit 154 which is operative to detect an anomaly in the pair of digital conversion codes of the analog signal input value corresponding to the conversion transition region 156 of the pre-aligned quantizer pair 142 and 144 and to generate a signal 158 in response to the detected anomalous condition, and a second circuit 160 governed by the generated anomaly signal 158 and the pair of digital conversion codes associated therewith to adjust the conversion dynamic range of at least one of the pair of quantizers 142 and 144 in order to ameliorate the anomalous condition.

Digital quantizers of the model type AMD6688 generally provide an overrange or saturation bit in the conversion digital code output thereof. When this overrange bit is positive, it is an indication that the conversion dynamic subrange of the quantizer associated therewith is saturated. One set of unique digital conversion codes for the conversion transition region 156 is shown in Table 4 below.

TABLE 4

| STATE | STATUS BITS | | SIGNAL CONDITION | CORRECTION |
|---|---|---|---|---|
| | SAT BIT Lower SR | 1st Threshold High SR | | |
| 1 | 0 | 0 | Signal too low for either detection | none |
| 2 | 1 | 0 | Signal trips lower but not higher | yes Increment Pos. |
| 3 | 0 | 1 | Signal trips high SR + not low SR | yes Increment Neg. |
| 4 | 1 | 1 | Low and High detected | none |

(SR = subrange)

The specific events of the described example which are to be detected by the first circuit 154 occur when the input error signal ε is at an amplitude where the lower subrange quantizer 144 is saturated (i.e. saturation bit positive) and the higher subrange quantizer 142 is at the first threshold (i.e. 001). In the status bit columns of Table 4 as shown hereabove, digital codes representative of the states of the lower subrange saturation bit and the first threshold of the higher subrange are depicted. The Signal Condition column provides the relative conditions of the analog error signal ε. Finally, the column entitled CORRECTION indicates the required action to be taken to ameliorate the anomalous condition. The corrective action will become better understood from the expanded description thereof in the following paragraphs.

What should be kept in mind is that there should not be a gap or overlap between the conversion dynamic ranges of the pair of quantizers 142 and 144. States 2 and 3 of Table 4 indicate the status bit codes for gap and overlap anomalous conditions, respectively, for the present example. An alignment within tolerance limits prevents the two middle conditions of Table 4 from occurring and no correction is called for under these conditions because the conversion codes of the threshold always trip together at the same point. If the alignment should become misaligned due to aging or temperature variations, for example, then one conversion code will occur without the other whenever the input signal ε is at the threshold level. Under this condition, corrections are needed as indicated in Table 4 hereabove.

Figure 8:
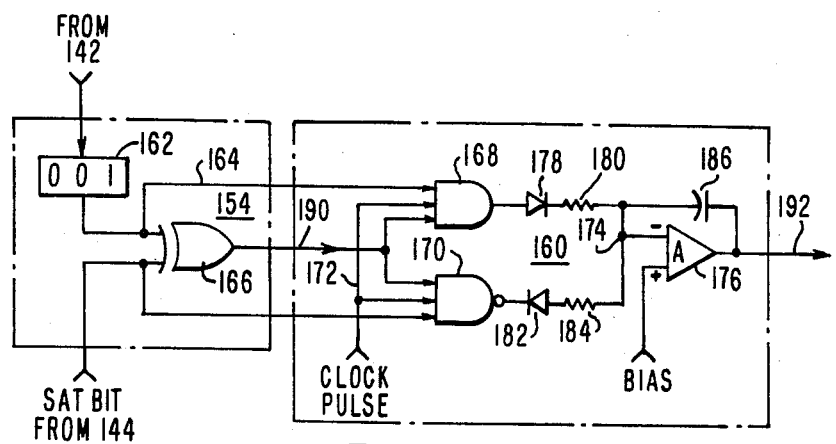
FIG. 8 is a schematic of a circuit suitable for embodying the alignment maintaining apparatus of the embodiment of FIG. 6.

A suitable embodiment for the alignment maintaining apparatus 154 and 160 is shown in FIG. 8. Specifically, the conversion digital code from the higher subranged quantizer 142 is provided to a decoder 162 of functional block 154. The decoder 162 may be preset to decode the conversion code 001 which is the first threshold of the higher subrange. A signal line 164 from the decoder 162 may be supplied to one input of an exclusive OR gate 166 and also to an input of an AND gate 168 of the functional block 160. The saturation bit from the conversion code of lower subranged quantizer 144 may be supplied to the other input of the exclusive OR gate 166 and to one input of a conventional NAND gate 170 of the block 160. The output of the exclusive OR gate 166 may be supplied to another input of both the AND gate 168 and the NAND gate 170. A clocking pulse over signal line 172 may also be supplied to an input of each of the AND gate 168 and NAND gate 170. The output of the gate 168 is coupled to the summing junction 174 of an operational amplifier 176 through a blocking diode 178 and a resistor 180. Similarly, the output of the NAND gate 170 is also coupled to the summing junction 174 through another diode 182 and resistor 184. The diodes 178 and 182 are disposed in the circuitry of 160 in such a manner as to permit current to flow from the gate 168 to the summing junction 174 when the gate 168 is in a high-potential state and to block current from flowing therebetween when the gate 168 is in a low-potential state and to permit current to flow from the summing junction 174 to the gate 170 when the gate 170 is in a low-potential state and to block current from flowing therebetween when the gate 170 is in a high-potential state. A capacitor 186 is coupled across the summing junction 174 and the output of the amplifier 176 to form an integrator-type circuit. A bias signal may be supplied to the non-inverting input (+) of the operational amplifier 176.

The embodiment described in connection with the circuitry of FIG. 8 operates according to the Truth Table of TABLE 4. More specifically, the exclusive OR gate 166 determines when the status bits from the conversion codes of the quantizers 142 and 144 are in the anomalous states 2 and 3 and provide an anomalous signal 190 to the functional block 160 which enables the gates 168 and 170. The gates 168 and 170 determine if there is a gap or an overlap condition in the subranges at the threshold (i.e. reference numeral 156 in FIG. 7) and govern the integrator circuit of 160 to take corrective action. The output 192 of the integrator circuit or operational amplifier 176 may be coupled to the reference voltage potential of one of the quantizers 144 or 142 for adjustment thereof. In the present embodiment, the output 192 is coupled to the reference potential of the higher subranged quantizer 142. If there is a gap between the subranges at the threshold 156, then the NAND gate 170 is effected to a low potential for the duration of the clock pulse 172 thus incrementing an increase in the reference potential 192. Conversely, if there is an overlap of subranges at the threshold 156, then gate 168 is effected to a high potential for the duration of the clock pulse 172 to provide current flow to the summing junction 174 thus decrementing the reference voltage potential over signal line 192. In each case, the corrective action in adjusting the reference potential ameliorates the anomalous condition.

It is understood that the embodiment described in connection with the circuitry of FIG. 8 may correct the misalignment of subranges with one or more clock pulses at one occurrence of the threshold 156 or it may require a number of occurrences of the threshold 156 in order to complete the realignment process. In either event, the misalignment will be ultimately corrected and maintained.

It is further understood that while an analog integrator is used in the embodiment of FIG. 8, a digital integrator may be substituted therefor without deviating from this inventive aspect. The digital integrator may comprise an up/down counter and a digital-to-analog converter which may supply the analog reference potential to the appropriate quantizer, the configuration of the two being well-known. The up/down counting of the counter may be established by similar gate arrangements as that shown by 168 and 170. This is just one modification which could be made to the embodiment of FIG. 8 and other modifications and additions could also be made without deviating from the invention. Accordingly, it is not the intention of this specification to set forth any one particular embodiment for this inventive aspect, but rather to have the invention be construed in breadth and broad scope according to the appended claims.

The description heretofore has disclosed apparatus for maintaining the alignment of the conversion dynamic subranges which have been prealigned at a predetermined threshold therebetween (refer to 156 of FIG. 7). This adequately provides for maintaining the alignment of the offset of the two subranges, however does nothing for the gain. It has been recognized that if the conversion dynamic ranges of the subranged quantizers are prealigned to effect a unique set of digital conversion codes at two thresholds instead of just one, then both offset and gain alignment may be maintained. This may be accomplished using the principles of the present inventive aspect as has been described hereabove in connection with the embodiments of FIGS. 6, 7 and 8. Three-bit quantizer mechanizations will also be used in the following description solely to make for a simple example. It is understood that the number of quantizer conversion bits is not limited to three, and may be expanded to any number, limited only by the practical problems associated therewith. The example which will be described in connection wth FIGS. 9, 10 and 11 include two 3-bit subranged quantizers which are combined to have one overlapping bit as is conventionally the combining technique.

Figure 9:
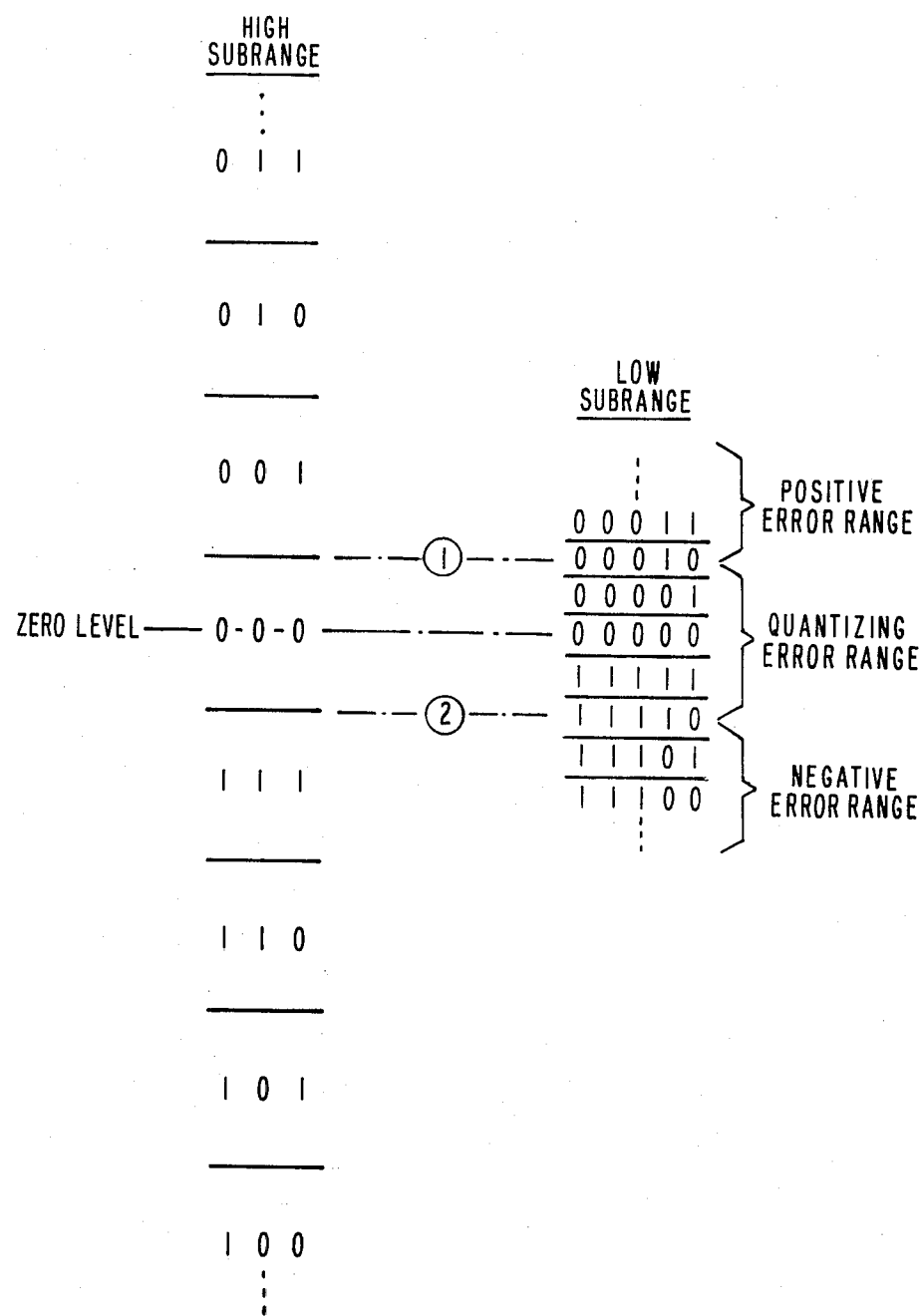
FIG. 9 illustrates a pre-alignment of two subranges to yield two thresholds and a set of conversion digital codes associated therewith.
Figure 10:
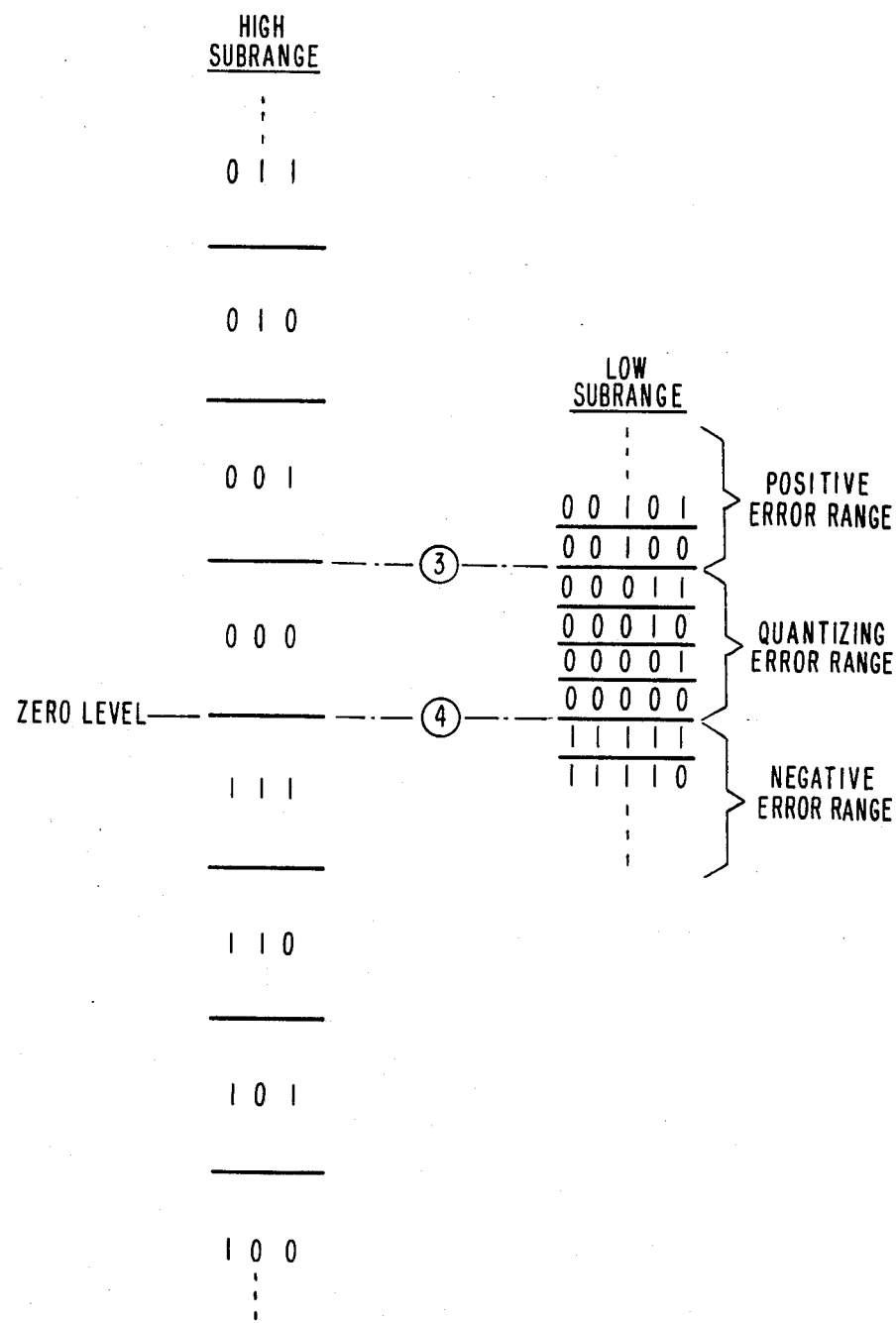
FIG. 10 illustrates another pre-alignment of two subranges to yield two thresholds found more suitable for the alignment aspect of the present invention.

FIG. 9 illustrates a prealignment of the two subranges to yield two thresholds ① and ② and a set of conversion digital codes associated therewith. It is readily apparent that to center the dynamic conversion range of the quantizers, the reference midrange digital codes thereof are moved conveniently one-half quantum. This alignment centers the analog error signal digitization to allow a convenient digital approach for processing. However, after examining the self-alignment principles discussed hereabove in connection with the FIGS. 6, 7 and 8, it is evident that the prealignment thresholds ① and ② are not the best choices because the digital codes associated therewith do not line up between the subranges. To improve upon this undesirable situation, the subranges may be prealigned to effect the threshold assignments ③ and ④ to provide conversion digital codes which align as shown by the illustration of FIG. 10. The threshold prealignments of illustration FIG. 10 may be achieved by digitally changing the quantizer output codes (i.e., adding a fixed digital number, for example) and by not providing the one-half quantum offset of the midrange codes associated with the illustration of FIG. 9.

Figure 11:
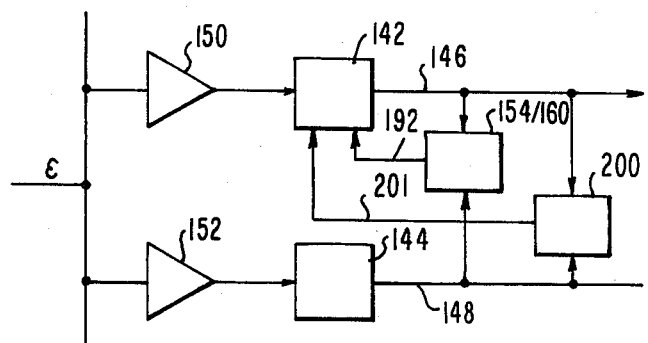
FIG. 11 is an alternate embodiment for the self-alignment aspect of the present invention involving both gain and offset alignment of a pair of subranged quantizers.

A simple functional block diagram schematic as depicted in FIG. 11 may be used to describe an embodiment of apparatus for each prealigned pair of quantizers 142 and 144 for maintaining the conversion dynamic range alignment of both thresholds ③ and ④ for both gain and offset. The embodiment of FIG. 11 is similar to that described in connection with FIG. 6 except that it has two apparatus blocks 154/160 and 200 for maintaining the conversion dynamic range alignment of the quantizers 142 and 144 for both thresholds ③ and ④ as illustrated in FIG. 10. The embodiments of both apparatus blocks 154/160 and 200 may be similar to that described in connection with the embodiment of FIG. 8.

More specifically, the first block 154/160 may be operative to detect an anomaly in the pair of digital conversion codes of the analog error signal value corresponding to the conversion transition region of the upper threshold ③ and to generate a first signal in response to the detected anomalous condition of the upper threshold ③. Moreover, consistent with the embodiment of FIG. 10, the apparatus block 154/160 may be governed by the generated first signal and the digital conversion codes associated therewith to, at times, adjust the one reference potential of at least one of the pair of quantizers in a direction to ameliorate the condition of the upper threshold. The other apparatus block 200 may be operative to detect an anomaly in the pair of digital conversion codes of the analog signal input value corresponding to the conversion transition region of the lower threshold ④ and to generate a second signal in response to the detected anomalous condition of the lower threshold. Moreover, the apparatus block 200 may be governed by the generated second signal and the digital conversion codes associated therewith to at times adjust the other reference potential via signal line 201 of at least one of the pair of quantizers in a direction to ameliorate the anomalous condition of the lower threshold ④.

In the present embodiment, it was recognized that because of the 2's complement configuration of the higher subrange quantizer 142 its upper and lower reference voltage potentials may be adjusted independently of one another. Thus, in the present embodiment, the signal line 192 of the apparatus block 154/160 may be coupled to the upper reference potential and the signal line 201 of the apparatus block 200 may be coupled to the lower reference potential of the higher subrange quantizer 142. Both of the apparatus blocks 154/160 and 200 may operate much the same as that described in connection with the embodiment of FIG. 8 except that a different conversion code is preset in each of the decoder blocks 162 thereof. It is also recognized that the saturation bit from the lower subrange quantizer 144 is no longer used, thus a decoder may be provided for each of the apparatus blocks and preset to decode the appropriate conversion codes in accordance with the prealignment such as shown by the illustration of FIG. 11.

Figure 12:
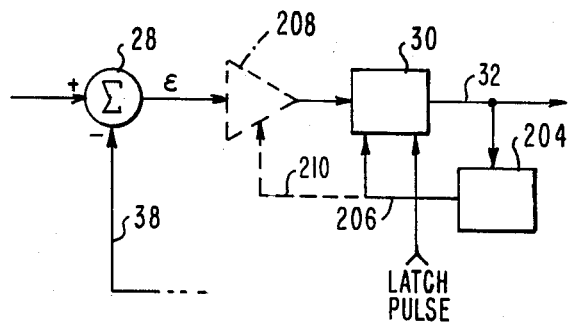
FIG. 12 is a functional block diagram schematic of a portion of an A/D converter with a single time-shared quantizer suitable as an alternate embodiment for embodying the self-alignment aspect of the present invention.

In another embodiment in which a single quantizer is time-shared to render multiple subranged digital conversions of an analog signal input similar to that described in connection with the block diagram schematic of FIG. 1, each conversion dynamic subrange may be prealigned with the next higher conversion dynamic subrange to effect a unique set of digital conversion codes of the analog signal input value corresponding to a conversion transition region between the prealigned subranges like that shown in the illustration of FIG. 10, for example. The exemplary embodiment of FIG. 12 is a functional block diagram schematic depicting the addition of apparatus 204 for each prealigned pair of subranged conversions for maintaining the conversion dynamic subrange alignment thereof. The apparatus 204 has coupled to its inputs the conversion digital codes of the time shared quantizer 30 and may be coupled to the quantizer 30 over signal line 206 for adjusting at least one of the conversion dynamic subranges of the pair thereof. In addition, one or more gain adjusting amplifiers 208 may be disposed between the summer unit 28 and time shared quantizer 30 for gain adjusting the error signal ε corresponding to each subrange conversion. In these embodiments, the apparatus 204 may have its adjustment output coupled to the amplifier 208 with the signal line 210 for adjustment of its gain in order to alter the conversion dynamic subrange thereof.

In either case, the apparatus 204 may be operative to compare the pair of subranged conversions of the analog signal input value corresponding to the conversion transition region ③ or ④ or a combination of the two of said pair to detect an anomaly in the digital conversion codes thereof and to adjust at least one of the conversion dynamic ranges of the pair of subranged conversions to ameliorate the anomolous condition as governed by the detected anomalous condition and the pair of digital conversion codes associated therewith. A typical truth table used to define typical operations of the apparatus 204 is shown in Table 5 herebelow. Referring to Table 5, the term UPPER SR refers to the conversion digital code of the higher subrange and the term LOWER SR refers to the states of the lower subrange. The designations N−1, N, and N+1 refers to the conversion digital codes of one level below the threshold level, the threshold level, and one level above the threshold level for the upper subrange. For example, for the 3-bit illustration in accordance with FIG. 10, N refers to the digital code 000. Likewise, N−1 refers to 111 and N+1 refers to 001. For the lower subrange 0 and k/2 denotes the conversion digital codes of the lower and upper extensions of the threshold level of the upper subrange. For example, in the illustration of FIG. 10, 0 refers to the digital code 111 and k/2 refers to the code 100.

TABLE 5

| UPPER SR | | | LOWER SR | | | |
|---|---|---|---|---|---|---|
| N−1 | N | N+1 | 0 | k/2 | CONDITIONS | CORRECTIONS |
| 0 | X | X | X | X | Signal out of Range-Block U7 and U8 | None |
| 1 | 0 | 0 | X | 0 | Signal still not high enough to trip thresholds being | None |

TABLE 5-continued

| UPPER SR | | | LOWER SR | | | |
|---|---|---|---|---|---|---|
| N−1 | N | N+1 | 0 | k/2 | CONDITIONS | CORRECTIONS |
| | | | | | matched | |
| 1 | 0 | 0 | X | 1 | Trips lower subrange but not the higher subrange | Yes–Negative |
| 1 | 1 | 0 | 0 | X | Trips higher subrange but not the lower subrange | Yes–Positive |
| 1 | 1 | 0 | 1 | X | Trips higher subrange and the lower subrange | None |
| 1 | 1 | 1 | X | X | Signal out of range-Block U7 and U8 | None |

(X = don't care)

Figure 13:
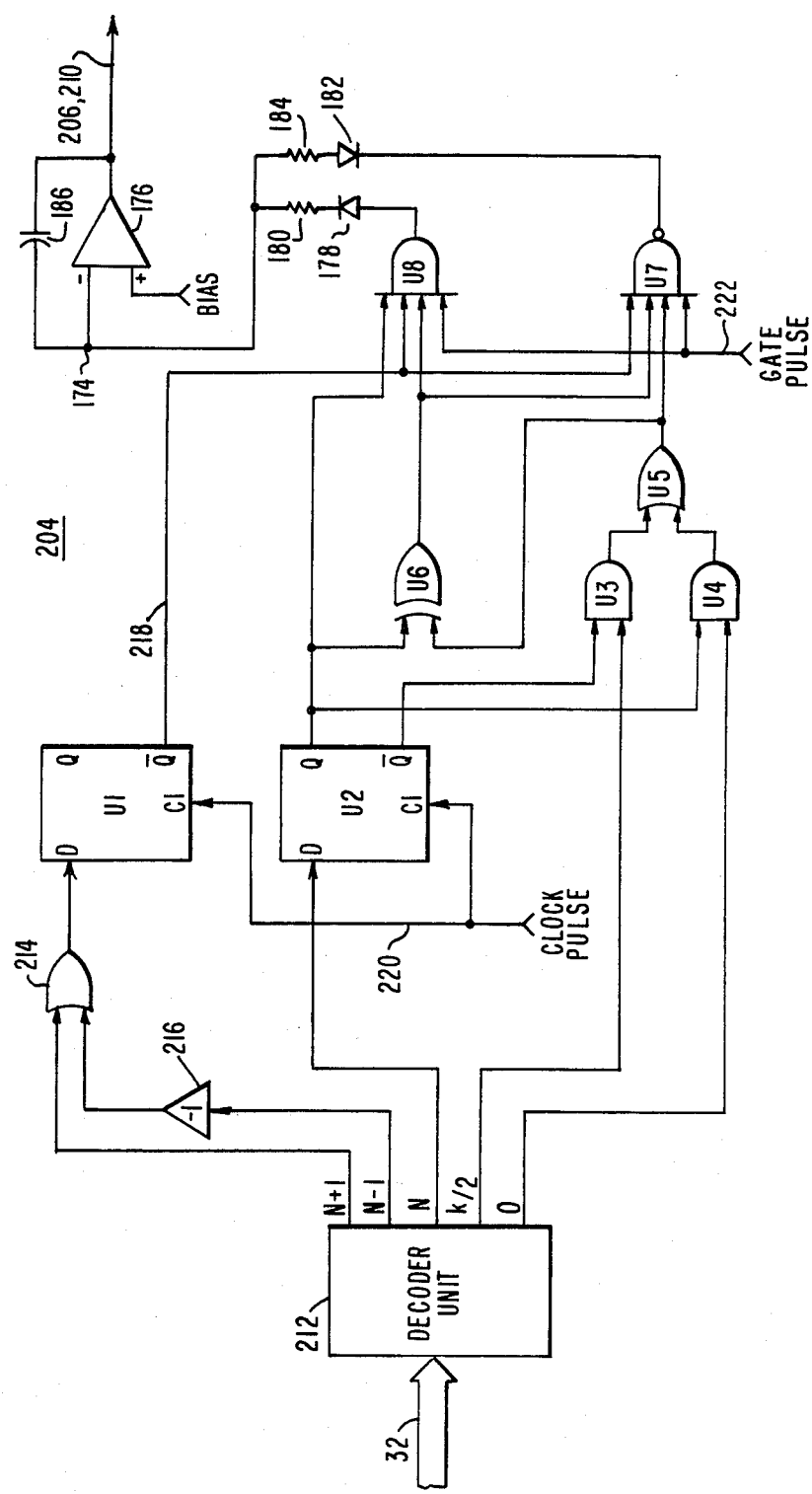
FIG. 13 is a schematic of a circuit suitable for embodying the self-alignment apparatus in the embodiment of FIG. 12.

One embodiment of the apparatus 204 suitable for implementing the operations of the truth table of Table 5 is depicted in the block diagram schematic of FIG. 13. More specifically, the conversion digital codes of the quantizer 30 over signal lines 32 may be input to a decoder unit 212 which is preset to decode the various conversion codes N+1, N−1, N, k/2, and 0. The signal line for the N+1 decoding is provided to one input of an OR gate 214 and the signal line for the N−1 decoding is inverted by an inverter 216 and supplied to the other input of the OR gate 214. The output of the OR gate 214 is provided to the data input D of a flip-flop U1 which has its $\overline{Q}$ output 218 provided to an input of each of an AND gate U8 and a NAND gate U7. The signal line of the N decoding is provided to the data D input of another flip-flop U2. A clock pulse is provided over signal line 220 to each of the clock inputs of the flip-flops U1 and U2. The Q output of the U2 flip-flop is provided to one input of an AND gate U4, one input to an exclusive OR gate U6 and one input of the AND gate U8. The $\overline{Q}$ output of the flip-flop U2 is provided to one input of the AND gate U3. The decoded signal for k/2 is provided to the other input of the AND gate U3 and similarly, the decoded input for the "0" code is provided to the other input of the AND gate U4. The outputs of the two AND gates U3 and U4 are provided to the inputs of an OR gate U5 which has its output coupled to the other input of the exclusive OR gate U6 and one input of the NAND gate U7. The exclusive OR gate U6 has its output coupled to both one input of the AND gate U8 and one input of the NAND gate U7. Gating or enabling pulses are provided to the inputs of both gates U7 and U8 over signal lines 222. The remaining circuitry which is coupled to the outputs of the gates U8 and U7 is similar to the integrator circuit arrangement as described in connection with the embodiment of FIG. 9. The output of the integrator amplifier 176 may be coupled to either the reference potential of the quantizer 30 over signal line 206 or the gain adjustment of a gain adjusting amplifier 208 over signal line 210.

In a typical analog-to-digital conversion operation using a time-shared quantizer 30, the higher subrange conversion is generally performed first with the feedback signal provided over signal line 38 to the summer 28 (see FIG. 12) reducing the error ε into the lower subrange group allowing for the second quantizer conversion in the lower subrange region. Thus, the higher subrange conversion digital code will appear over signal lines 32 first in sequence and then the lower subrange conversion digital codes will appear next in sequence. In connection with the truth table of Table 5 the status of the digital conversion codes of the upper subrange are stored in the flip-flops U1 and U2 of the embodiment of FIG. 13 to be compared with the conversion digital codes of the lower subrange, converted next in sequence, in the combinational logic of gates U3, U4, U5 and U6.

In a typical operation, if the conversion digital code of the upper subrange is outside the threshold level N (i.e. 000 for the present example) the signal over signal line 218 is in a state to block the gates U7 and U8 from operating the integrator circuitry. If the digital conversion code is within the threshold level N, it is detected by the flip-flop U2 and, with the clock pulse 220, the proper states are transferred to the outputs Q and $\overline{Q}$ thereof. Upon the conversion of the lower subrange, the decoder 212 identifies the status of the conversion codes k/2 and 0 and provides it to the corresponding gates U3 and U4. The combinational logic of gates U3, U4, U5 and U6 determines an anomaly in the unique conversion digital codes associated with the alignment of the two subranges and governs the operation of the integrator circuitry through the AND gate U8 and NAND gate U7 in accordance with the conditions and corrections set forth in the truth table of Table 5. The gate pulse over signal lines 222 determines the incremental time of operation of the integrator circuit to adjust the correction voltage potential over signal lines 206 or 210.

In summary then, the apparatus described in connection with the embodiment of FIGS. 12 and 13 is used where a single quantizer is time-shared for both the prealigned subranges. The alignment status from the higher subrange is stored and compared later to the alignment status of the lower subrange utilizing predetermined conversion codes thereof. Allowance is made for the feedback of the D/A converter and thus self-alignment is achieved. The output of the apparatus 204 provides a correction voltage that can be used to alter the quantizer reference voltage levels from one subrange to the next or it can be used to alter the gain or offset or a combination of the two of the analog amplifiers 208. From the description provided hereabove in connection with the principles of the present invention, it is evident that in order to align offset and gain for each pair of subranges, two threshold levels are needed and thus two correction circuits of the type described in connection with FIG. 13 would be required. This has already been described for an embodiment including parallel quantizers in connection with the block diagram schematic of FIG. 11.

Although the self-alignment apparatus has been described in connection with the alternate embodiments of FIGS. 8 and 13, it is understood that other embodiments may be used to perform these logical operations such as a time-shared, sequentially operated, programmed machine, like a microprocessor, for example, without deviating from the principles of the present invention. It is understood that in practice, a microprocessor would hardly be justified to self-align a simple two subranged analog-to-digital converter, but when a system involves multiple A/D converters using several subranges for each A/D conversion, then a single microprocessor may be programmed in accordance with the inventive principles described hereabove to keep all of them aligned and this would be entirely practical. Of course, a decision to use or not to use a programmed processor would be based on such factor as maintainability, cost, complexity, reliability, and the like, for example.

I claim:

1. A subranging analog-to-digital (A/D) converter for converting a sampled analog input signal into corresponding n-bit digital words representative thereof comprising:
   an arithmetic unit for generating a series of error signals for each analog input signal sample, said error signals of a series being representative of the differences between a signal representative of the corresponding analog input signal sample and a respectively corresponding series of feedback signals associated therewith;
   a plurality of parallel network branches for operating on each error signal simultaneously, each network branch i of said plurality including:
   means for gain adjusting each error signal with a gain $G_i$; and
   an $m_i$-bit quantizer cascaded therewith for converting each gain adjusted error signal of the branch i into an $m_i$-bit digital word representative thereof, the $m_i$ bits of said digital word output of each quantizer i being assigned predeterminately to a portion of the bits of an intermediate n-bit digital word which has a greater bit capacity than any of the $m_i$-bit digital words;
   said gain $G_i$ increasing progressively from one branch i to another branch i+1 in accordance with a predetermined range of quanta of the corresponding quantizers associated therewith;
   means for selecting at least one digital word conversion from the plurality of simultaneous conversions for each error signal based on the digital codes thereof to form said intermediate n-bit digital word corresponding to each error signal:
   said selecting means including:
   a digital date for each network branch except the branch having the lowest gain, each digital gate disposed in cacade with its corresponding branch quantizer and governed by a gate command signal to select the digital word conversion of its corresponding quantizer as a constituent in the formation of said intermediate n-bit digital words in accordance with the bit assignment thereof; and
   means for generating the gate command signals by generating the gate command signal for said digital gate of branch i+1 based on the conversion digital code of the quantizer output of branch i;
   means for accumulating each series of formed intermediate n-bit digital words by generating an intermediate accumulated n-bit digital word corresponding to each formed intermediate n-bit digital word of said series, each generated series of intermediate accumulated n-bit digital words being respectively representative of said series of feedback signals in accordance with their accumulating sequence; and
   means for storing the final accumulated n-bit digital word for each accumulating series of formed intermediate n-bit digital words as the n-bit digital word conversion of its corresponding analog input signal sample.

2. A subranging (A/D) converter in accordance with claim 1 wherein the accumulating means includes means for being reset to an initial state for each analog input sample, said initial state being representative of the initial feedback signal of the corresponding series associated therewith.

3. A subranging (A/D) converter in accordance with claim 1 including a digital-to-analog converter for converting the intermediate accumulated n-bit digital words into corresponding analog signals representing the feedback signals associated therewith; and wherein the arithmetic unit comprises an analog summing unit for generating the error signals from the corresponding pairs of an analog input signal sample and analog feedback signals related thereto.

4. A subranging (A/D) converter in accordance with claim 1 wherein the accumulating means includes a digital adder having as one input thereof the formed intermediate n-bit digital word; and a digital word storage register having its input coupled to the output of said digital adder and its output coupled to another input of said digital adder, said digital adder being operative to add the digital words coupled to its one and another inputs, and said digital word storage register being operative to store each resultant digital word summation of said digital adder which is resupplied to said input of said digital adder, whereby an intermediate accumulated digital word is stored in said digital word storage register for each formed intermediate n-bit digital word of a series.

5. The subranging (A/D) converter in accordance with claim 1 wherein each of the branch quantizers are configured for bipolar conversion operation to render a 2's complement digital word code; and wherein the selecting means further includes means for digital logically "or"ing the most significant bit of a selected digital word conversion with all of the bits of the selected words of greater significance in the formation of the intermediate n-bit digital word.

6. The subranging (A/D) converter in accordance with claim 5 wherein the number of network branches is three with each network branch including a 5-bit quantizer; wherein the corresponding gain adjustment means for the network branches have gains proportional to 1/16, 1, and 16 respectively; and wherein formed intermediate and intermediate and final accumulated digital words each have a capacity of 13 bits.

7. The subranging (A/D) converter in accordance with claim 5 wherein the number of network branches is two with each network branch including an 8-bit quantizer; wherein the corresponding gain adjustment means for the network branches have gains proportional to $\frac{1}{8}$ and 16, respectively; and wherein the formed intermediate and intermediate and final accumulated digital words each have a capacity of 15 bits.

8. The subranging (A/D) converter in accordance with claim 1 wherein the number of network branches is three including quantizers of 5-bit, 4-bit and 4-bit and corresponding gain adjustment means having gains in proportion to 1/256, 1/16 and 1, respectively; and wherein the formed intermediate and intermediate and final accumulated digital words each have a capacity of 13 bits.

* * * * *